(12) United States Patent
Kimura et al.

(10) Patent No.: US 12,537,501 B2
(45) Date of Patent: Jan. 27, 2026

(54) ACOUSTIC WAVE DEVICE

(71) Applicant: Murata Manufacturing Co., Ltd., Nagaokakyo (JP)

(72) Inventors: Tetsuya Kimura, Nagaokakyo (JP); Shintaro Kubo, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 202 days.

(21) Appl. No.: 18/239,840

(22) Filed: Aug. 30, 2023

(65) Prior Publication Data

US 2023/0412139 A1   Dec. 21, 2023

Related U.S. Application Data

(63) Continuation of application No. PCT/JP2022/004903, filed on Feb. 8, 2022.
(Continued)

(51) Int. Cl.
   *H03H 9/02* (2006.01)
   *H03H 9/13* (2006.01)
   *H03H 9/56* (2006.01)

(52) U.S. Cl.
   CPC .... *H03H 9/02015* (2013.01); *H03H 9/02228* (2013.01); *H03H 9/132* (2013.01); *H03H 9/564* (2013.01)

(58) Field of Classification Search
   CPC ........... H03H 9/02015; H03H 9/02228; H03H 9/132; H03H 9/564; H03H 2003/021; H03H 3/02; H03H 9/02157; H03H 9/173
   (Continued)

(56) References Cited

U.S. PATENT DOCUMENTS

| 2013/0057360 A1 | 3/2013 | Meltaus et al. |
| 2014/0145556 A1 | 5/2014 | Kadota |

(Continued)

FOREIGN PATENT DOCUMENTS

| JP | 2009077159 A | 4/2009 |
| JP | 2013528996 A | 7/2013 |

(Continued)

OTHER PUBLICATIONS

International Search Report in PCT/JP2022/004903, mailed Mar. 29, 2022, 3 pages.

(Continued)

*Primary Examiner* — Jorge L Salazar, Jr.
(74) *Attorney, Agent, or Firm* — Keating & Bennett, LLP

(57) ABSTRACT

An acoustic wave device includes a support including a support substrate, a piezoelectric layer on the support, and an excitation electrode on the piezoelectric layer. A cavity portion is provided in the support and overlaps at least a portion of the excitation electrode. A portion of the piezoelectric layer that overlaps the cavity portion is a membrane portion. The membrane portion includes first and second directions orthogonal or substantially orthogonal to each other. The membrane portion includes a central portion in the center in the first direction, first and second portions facing each other across the central portion in the first direction, and an outer peripheral edge. At least a portion of the outer peripheral edge of the first and second portions of the membrane portion is located in an outer side portion in the second direction relative to the outer peripheral edge in the central portion.

20 Claims, 16 Drawing Sheets

Related U.S. Application Data

(60) Provisional application No. 63/159,153, filed on Mar. 10, 2021.

(58) Field of Classification Search
USPC .................................. 333/186, 187, 193–196
See application file for complete search history.

(56) References Cited

U.S. PATENT DOCUMENTS

| | | | |
|---|---|---|---|
| 2014/0152145 | A1 | 6/2014 | Kando et al. |
| 2017/0187352 | A1 | 6/2017 | Omura |
| 2021/0105002 | A1* | 4/2021 | Yantchev ........... H03H 9/02015 |
| 2021/0408994 | A1 | 12/2021 | Nagatomo et al. |

FOREIGN PATENT DOCUMENTS

| | | |
|---|---|---|
| JP | 6984800 B1 | 12/2021 |
| WO | 2012073871 A1 | 6/2012 |
| WO | 2013021948 A1 | 2/2013 |
| WO | 2016052129 A1 | 4/2016 |

OTHER PUBLICATIONS

Written Opinion in PCT/JP2022/004903, mailed Mar. 29, 2022, 4 pages.

\* cited by examiner

ACOUSTIC WAVE DEVICE

CROSS REFERENCE TO RELATED APPLICATIONS

This application claims the benefit of priority to Provisional Patent Application No. 63/159,153 filed on Mar. 10, 2021 and is a Continuation application of PCT Application No. PCT/JP2022/004903 filed on Feb. 8, 2022. The entire contents of each application are hereby incorporated herein by reference.

BACKGROUND OF THE INVENTION

1. Field of the Invention

The present invention relates to an acoustic wave device.

2. Description of the Related Art

Existing acoustic wave devices have been widely used in filters of mobile phones and the like. International Publication No. 2013/021948 discloses an example of an acoustic wave device using plate waves. In this acoustic wave device, a LiNbO$_3$ substrate is provided on a support. The support is provided with a through-hole. An interdigital transducer (IDT) electrode is provided on a portion facing the through-hole in the LiNbO$_3$ substrate.

In the acoustic wave device as described in International Publication No. 2013/021948, the thickness of a portion overlapping a cavity portion in a plan view is likely to vary, in a piezoelectric layer such as the LiNbO$_3$ substrate. Therefore, electrical characteristics of the acoustic wave device may deteriorate.

SUMMARY OF THE INVENTION

Preferred embodiments of the present invention provide acoustic wave devices that are each able to reduce or prevent variations in a thickness of a piezoelectric layer.

An acoustic wave device according to a preferred embodiment of the present invention includes a support including a support substrate, a piezoelectric layer on the support, and an excitation electrode on the piezoelectric layer. A cavity portion is provided in the support. At least a portion of the excitation electrode overlaps the cavity portion in a plan view. A portion of the piezoelectric layer overlaps the cavity portion in a plan view and defines a membrane portion. The membrane portion extends in a first direction and a second direction orthogonal or substantially orthogonal to the first direction, and the membrane portion includes a central portion located in a center in the first direction, a first portion and a second portion facing each other across the central portion in the first direction, and includes an outer peripheral edge. At least a portion of the outer peripheral edge in each of the first portion and the second portion of the membrane portion is located in an outer side portion in the second direction relative to the outer peripheral edge in the central portion.

With acoustic wave devices according to preferred embodiments of the present invention, it is possible to reduce or prevent variations in a thickness of a piezoelectric layer.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described with reference to the drawings to clarify the present invention.

The preferred embodiments described in this specification are each merely examples, and partial replacement or combination of configurations is possible between different preferred embodiments.

Figure 1:
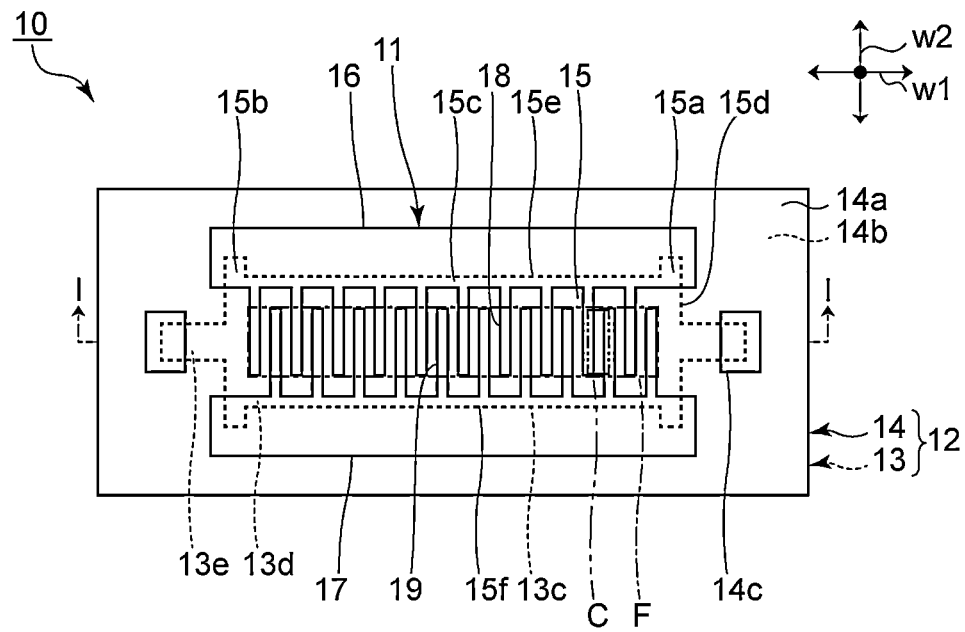
FIG. 1 is a schematic plan view of an acoustic wave device according to a first preferred embodiment of the present invention.
Figure 2:
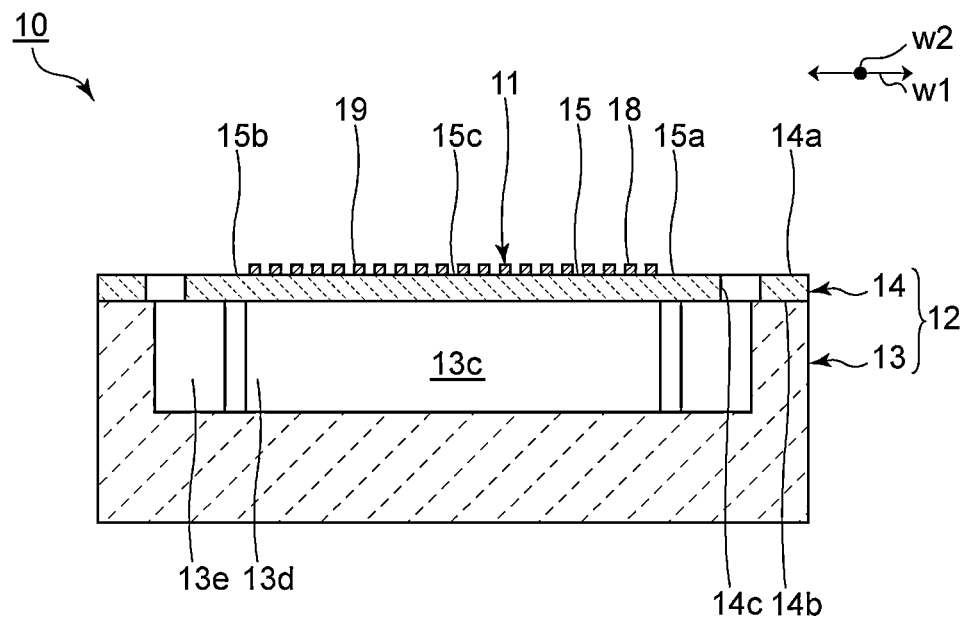
FIG. 2 is a schematic cross-sectional view taken along line I-I in FIG. 1.

FIG. 1 is a schematic plan view of an acoustic wave device according to a first preferred embodiment of the present invention. FIG. 2 is a schematic cross-sectional view taken along line I-I in FIG. 1.

As illustrated in FIG. 1, an acoustic wave device 10 includes a piezoelectric substrate 12 and an IDT electrode 11. As illustrated in FIG. 2, the piezoelectric substrate 12 includes a support 13 and a piezoelectric layer 14. The piezoelectric layer 14 is provided on the support 13. In the present preferred embodiment, the support 13 includes only a support substrate. However, the support 13 may be a multilayer substrate including a support substrate.

A cavity portion 13c is provided in the support 13. To be more specific, a recess is provided in the support 13. The piezoelectric layer 14 is provided on the support 13 so as to close the recess. Thus, the cavity portion 13c opened to the piezoelectric layer 14 side is provided in the support 13. As described above, in the present preferred embodiment, the cavity portion 13c is defined by a hollow portion, for example. However, the support 13 may include a through-hole, for example. The cavity portion 13c may be defined by the through-hole.

The piezoelectric layer 14 includes a first main surface 14a and a second main surface 14b. The first main surface 14a and the second main surface 14b face each other. Of the first main surface 14a and the second main surface 14b, the second main surface 14b is a main surface on the support 13 side. The piezoelectric layer 14 is, for example, a lithium niobate layer or a lithium tantalate layer. To be more specific, the piezoelectric layer 14 is a LiNbO$_3$ layer or a LiTaO$_3$ layer, for example.

The IDT electrode 11 as an excitation electrode is provided on the first main surface 14a of the piezoelectric layer 14. The IDT electrode 11 includes a pair of busbars and a plurality of electrode fingers. When a direction in which adjacent electrode fingers face each other is referred to as an electrode finger facing direction and a direction in which a plurality of electrode fingers extend is referred to as an electrode finger extending direction, in the present preferred embodiment, the electrode finger facing direction and the electrode finger extending direction are orthogonal or substantially orthogonal to each other. When an AC voltage is applied to the IDT electrode 11, acoustic waves are excited. The IDT electrode 11 may be a multi-layer metal film or may be a single-layer metal film.

The cavity portion 13c of the support 13 includes a first region 13d and a pair of second regions 13e. The pair of second regions 13e face each other across the first region 13d in a plan view. At least a portion of the IDT electrode 11 overlaps the first region 13d in a plan view. The first region 13d is a region to reflect the excited acoustic wave. In this specification, being in a plan view refers to viewing from a direction corresponding to an upper side in FIG. 2. The arrangement of the second region 13e is not limited to the above. Alternatively, the second region 13e need not be provided.

The piezoelectric layer 14 includes a membrane portion 15. The membrane portion 15 is a portion overlapping the first region 13d of the cavity portion 13c in a plan view. In FIG. 1, an outer peripheral edge of the cavity portion 13c is indicated by a broken line. An outer peripheral edge of the first region 13d of the cavity portion 13c coincides with an outer peripheral edge of the membrane portion 15. In this specification, the outer peripheral edge is an outer peripheral edge in a plan view.

In FIG. 2, the membrane portion 15 is schematically illustrated as having a planar shape. The membrane portion 15 in the present preferred embodiment has a shape that is convex from the second main surface 14b side to the first main surface 14a side in a sub-micron unit.

Returning to FIG. 1, the membrane portion 15 extends in a first direction w1 and a second direction w2. In the present preferred embodiment, the first direction w1 is parallel or substantially parallel to the electrode finger facing direction. However, the first direction w1 need not necessarily be parallel or substantially parallel to the electrode finger facing direction. The first direction w1 and the second direction w2 are orthogonal or substantially orthogonal to each other. In the acoustic wave device 10, a dimension of the membrane portion 15 along the first direction w1 is larger than a dimension of the membrane portion 15 along the second direction w2. Hereinafter, the dimension of the membrane portion 15 along the first direction w1 is referred to as the length of the membrane portion 15. The dimension of the membrane portion 15 along the second direction w2 is referred to as the width of the membrane portion 15.

The outer peripheral edge of the membrane portion 15 includes a first outer peripheral edge portion 15e and a second outer peripheral edge portion 15f. The outer peripheral edge is the outer peripheral edge of the membrane portion 15 in a plan view. The first outer peripheral edge portion 15e and the second outer peripheral edge portion 15f face each other in the second direction w2. The width of an arbitrary portion of the membrane portion 15 is a distance between the first outer peripheral edge portion 15e and the second outer peripheral edge portion 15f in the portion.

The membrane portion 15 includes a central portion 15c, a first portion 15a, and a second portion 15b. The central portion 15c is located at the center in the first direction w1. The first portion 15a and the second portion 15b face each other across the central portion 15c in the first direction w1. In the present preferred embodiment, the first portion 15a and the second portion 15b are located at both end portions of the membrane portion 15 in the first direction w1. The end portion includes an end edge portion 15d and a portion in the vicinity thereof.

As illustrated in FIG. 1, the membrane portion 15 has a hammerhead shape in the first portion 15a and the second portion 15b when viewed in a plan view. To be more specific, in the membrane portion 15, the widths of the first portion 15a and the second portion 15b are wider than the widths of the other portions. The widths of the portions other than the first portion 15a and the second portion 15b are constant or substantially constant. In other words, the outer peripheral edge of the membrane portion 15 has a shape protruding toward an outer side portion in the second direction w2 in the first portion 15a and the second portion 15b. The outer side portion in the second direction w2 refers to a direction away from the center of the membrane portion 15 in the second direction w2.

A feature of the present preferred embodiment is that respective portions of the outer peripheral edges in the first portion 15a and the second portion 15b of the membrane portion 15 are located in the outer side portion in the second direction w2 relative to an outer peripheral edge in the central portion 15c. At least a portion of the outer peripheral edge in the first portion 15a and the second portion 15b of the membrane portion 15 may be located in the outer side portion in the second direction w2 relative to the outer peripheral edge in the central portion 15c. As such, variations in the thickness of the piezoelectric layer 14 can be reduced or prevented. The details will be described below by comparing the present preferred embodiment with a first comparative example and a second comparative example.

Figure 3:
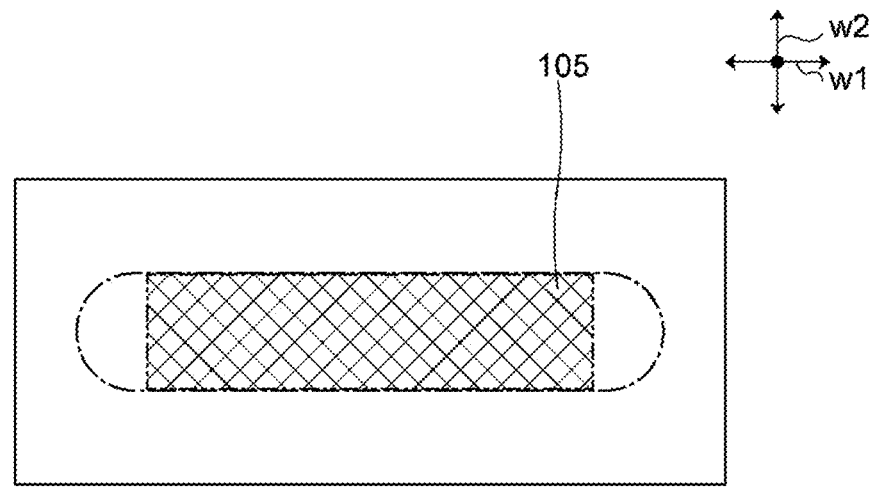
FIG. 3 is a schematic plan view illustrating a membrane portion of a first comparative example.
Figure 4:
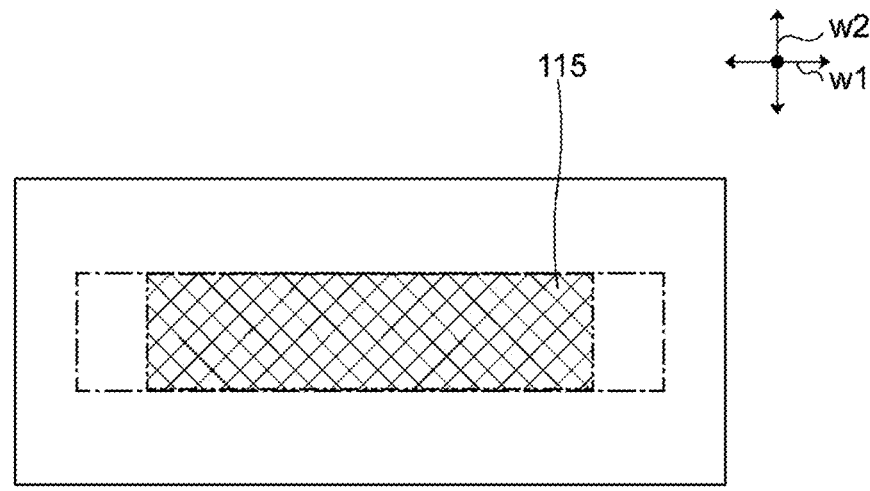
FIG. 4 is a schematic plan view illustrating a membrane portion of a second comparative example.

The first comparative example and the second comparative example are different from the present preferred embodiment in that the outer peripheral edge of the membrane portion does not include a portion protruding in the second direction w2. FIG. 3 and FIG. 4 illustrate membrane portions of the first comparative example and the second comparative example, respectively. In plan views in which the cavity portion is not illustrated, such as FIG. 3 and FIG. 4, the membrane portion is indicated by an alternate long and short dash line. As illustrated in FIG. 3, in the first comparative example, the shape of a membrane portion 105 in a plan view is an oval. As illustrated in FIG. 4, in the second comparative example, the shape of a membrane portion 115 in a plan view is a rectangle. In FIG. 3 and FIG. 4, a plurality of electrode fingers is arranged in hatched portions.

In each of the present preferred embodiment, the first comparative example, and the second comparative example, the distribution of the height of the first main surface of the piezoelectric layer in the first direction w1 was obtained. The height of the first main surface refers to a position of the first main surface in the height direction. The height direction is a direction parallel or substantially parallel to the stacking direction of the piezoelectric layer and the support. In the membrane portion, the higher the height of the first main surface, the thicker the thickness.

In the first comparative example and the second comparative example in which the above distribution was obtained, for example, the length of the membrane portion was set to about 300 μm and the width thereof was set to about 75 μm. In the present preferred embodiment, for example, a length a of the membrane portion 15 illustrated in FIG. 5 was set to about 300 μm, and a width b of the central portion 15c was set to about 75 μm. A width c of each of the first portion 15a and the second portion was set to about 85 μm. Note that a length d of each of the first portion 15a and the second portion 15b was set to about 10 μm.

Figure 6:
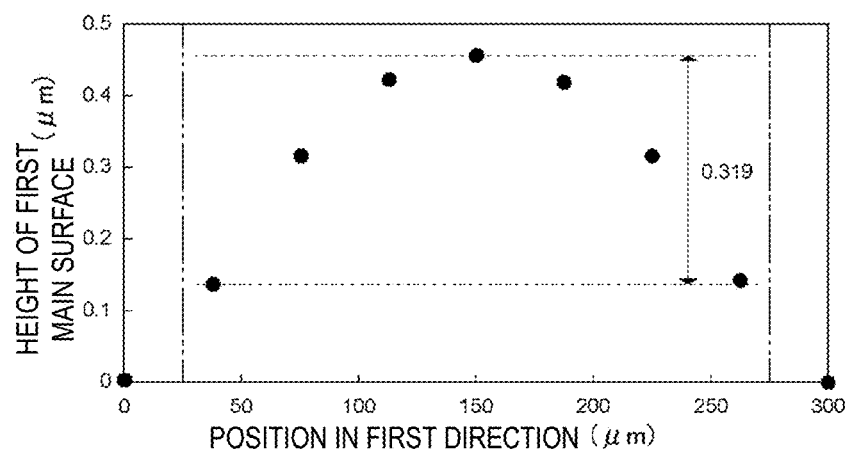
FIG. 6 is a graph illustrating the distribution of the height of a first main surface of a piezoelectric layer in a first direction in the first comparative example.
Figure 7:
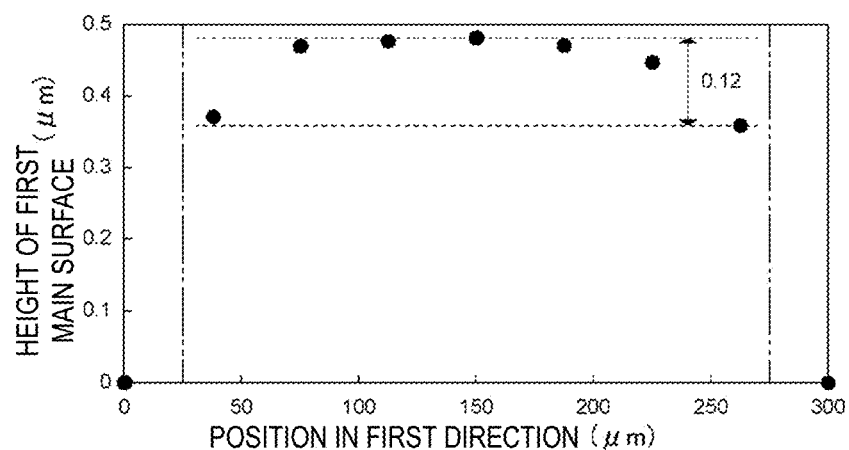
FIG. 7 is a graph illustrating the distribution of the height of a first main surface of a piezoelectric layer in the first direction in the second comparative example.
Figure 8:
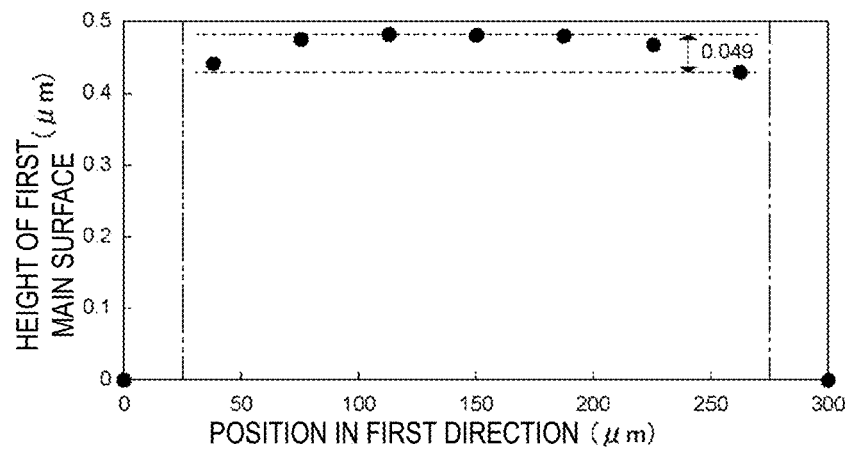
FIG. 8 is a graph illustrating the distribution of the height of a first main surface of a piezoelectric layer in the first direction in the first preferred embodiment of the present invention.

FIG. 6 is a graph illustrating the distribution of the height of the first main surface of the piezoelectric layer in the first direction in the first comparative example. FIG. 7 is a graph illustrating the distribution of the height of the first main surface of the piezoelectric layer in the first direction in the second comparative example. FIG. 8 is a graph illustrating the distribution of the height of the first main surface of the piezoelectric layer in the first direction in the first preferred embodiment. In FIG. 6 to FIG. 8, about 0 μm and about 300 μm on the horizontal axis indicate one end edge portion and the other end edge portion of the membrane portion, respectively, in the first direction w1. On the vertical axis, the height of the first main surface at the end edge portion of the membrane portion in the first direction w1 is used as a reference. A portion sandwiched between alternate long and two short dashes lines in each of FIG. 6 to FIG. 8 is a portion in which a plurality of electrode fingers is arranged.

As illustrated in FIG. 6, in the first comparative example, the height of the first main surface increases from the end edge portion toward the central portion in the first direction w1 of the membrane portion. The difference between the maximum and minimum values of the height in a portion excluding both end edge portions in the first direction w1 is as large as about 0.319 μm. As illustrated in FIG. 7, in the second comparative example, the first main surface is relatively flat in the vicinity of the central portion. However, the difference between the maximum and minimum values of the height in the portion excluding both end edge portions in the first direction w1 is about 0.12 μm, the above difference being relatively large. Therefore, in the first comparative example and the second comparative example, the variation in the thickness of the piezoelectric layer is large. On the other hand, as illustrated in FIG. 8, in the first preferred embodiment, the difference between the maximum and minimum values of the height in the portion excluding both end edge portions in the first direction w1 is as small as about 0.049 μm. Therefore, it can be seen that the variation in the thickness of the piezoelectric layer is reduced or prevented in the first preferred embodiment. The reason for this will be explained below.

Figure 9A:
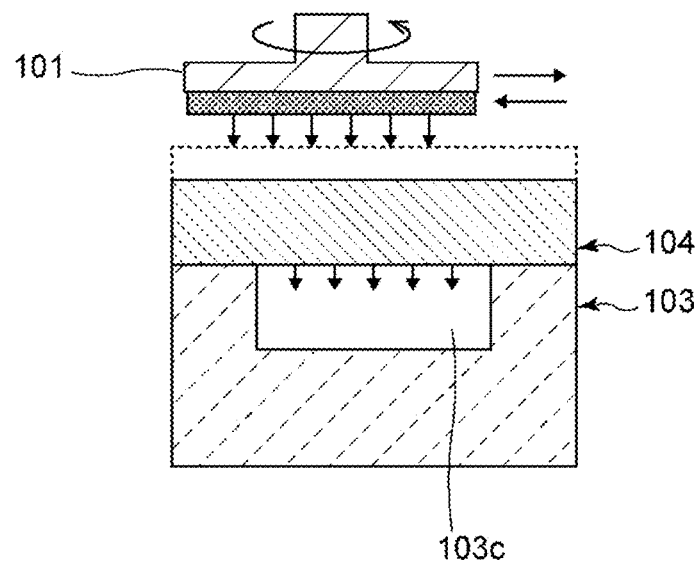
FIGS. 9A and 9B are schematic cross-sectional views for explaining a step of adjusting the thickness of the piezoelectric layer.
Figure 9B:
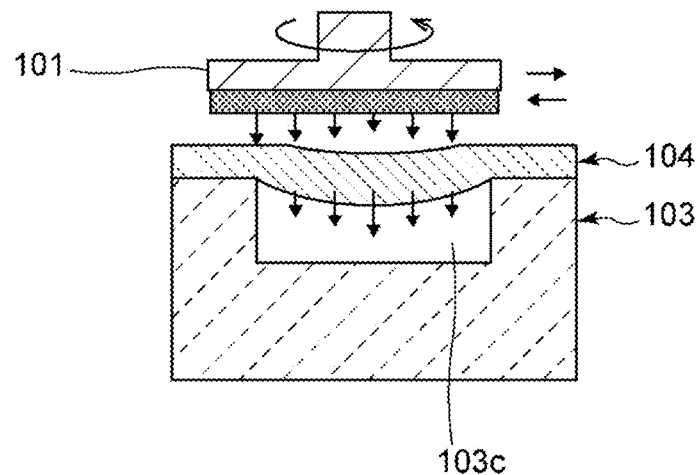

FIGS. 9A and 9B are schematic cross-sectional views for explaining a step of adjusting the thickness of the piezoelectric layer.

As illustrated in FIG. 9A, when the acoustic wave device is manufactured, the thickness of a piezoelectric layer 104 is adjusted. More specifically, in a state where the piezoelectric layer 104 is bonded to a support 103, the thickness of the piezoelectric layer 104 is adjusted by, for example, polishing by a polishing machine 101. The polishing machine 101 rotates and polishes the surface of the piezoelectric layer 104 while moving on the piezoelectric layer 104.

At this time, the inside of a cavity portion 103c is, for example, a vacuum. Therefore, in a portion of the piezoelectric layer 104 facing the cavity portion 103c, a difference in pressure occurs between the first main surface side and the second main surface side. Due to the difference in pressures, the piezoelectric layer 104 is bent so as to be convex toward the cavity portion 103c side. However, when the thickness of the piezoelectric layer 104 is large, since the stiffness of the piezoelectric layer 104 is sufficiently high, the deflection of the piezoelectric layer 104 is small. Thus, the piezoelectric layer 104 is uniformly or substantially uniformly polished.

However, as the piezoelectric layer 104 is polished and the thickness of the piezoelectric layer 104 decreases, the stiffness of the piezoelectric layer 104 decreases. Therefore, as illustrated in FIG. 9B, as the thickness of the piezoelectric layer 104 decreases, the deflection of the piezoelectric layer 104 increases due to the difference in pressure. In the piezoelectric layer 104, the farther away from the portion supported by the support 103, the weaker the constraint by the support 103. Therefore, the piezoelectric layer 104 is particularly largely bent at the center of the portion of the piezoelectric layer 104 facing the cavity portion 103c. Therefore, the closer to the above center, the smaller the force with which the piezoelectric layer 104 is pressed by the polishing machine 101. Therefore, the closer to the center, the smaller the amount by which the piezoelectric layer 104 is polished, and the thicker the piezoelectric layer 104 becomes.

On the other hand, in the first preferred embodiment illustrated in FIG. 1, the membrane portion 15 has a hammerhead shape in the first portion 15a and the second portion 15b. To be specific, the outer peripheral edge in the first portion 15a of the membrane portion 15 is located in the outer side portion in the second direction w2 relative to the outer peripheral edge of the central portion 15c. Similarly, the outer peripheral edge in the second portion 15b is located in the outer side portion in the second direction w2 relative to the outer peripheral edge of the central portion 15c. As such, in the step illustrated in FIG. 9B, the deflection of the piezoelectric layer 104 can be made uniform or substantially uniform. As a result, in the portion to be the membrane portion 15, it is possible to reduce the deviation of the amount to be polished, and to make the thickness of the membrane portion 15 uniform or substantially uniform.

The portion located in the first portion 15a in the outer peripheral edge includes a portion located in the first portion 15a in the first outer peripheral edge portion 15e and a portion located in the first portion 15a in the second outer peripheral edge portion 15f. The same applies to the central portion 15c and the second portion 15b. In the present preferred embodiment, in both of the first outer peripheral edge portion 15e and the second outer peripheral edge portion 15f, the respective portions located in the first portion 15a and the second portion 15b are located in the outer side portion in the second direction w2 relative to the portion located in the central portion 15c. As such, it is possible to effectively reduce or prevent the variation in the thickness of the piezoelectric layer 14.

However, in at least one of the first outer peripheral edge portion 15e and the second outer peripheral edge portion 15f, the portion located in the first portion 15a may be located in the outer side portion in the second direction w2 relative to the portion located in the central portion 15c. Similarly, in at least one of the first outer peripheral edge portion 15e and the second outer peripheral edge portion 15f, the portion located in the second portion 15b may be located in the outer side portion in the second direction w2 relative to the portion located in the central portion 15c. Also in these cases, the variation in the thickness of the piezoelectric layer 14 can be reduced or prevented.

Figure 5:
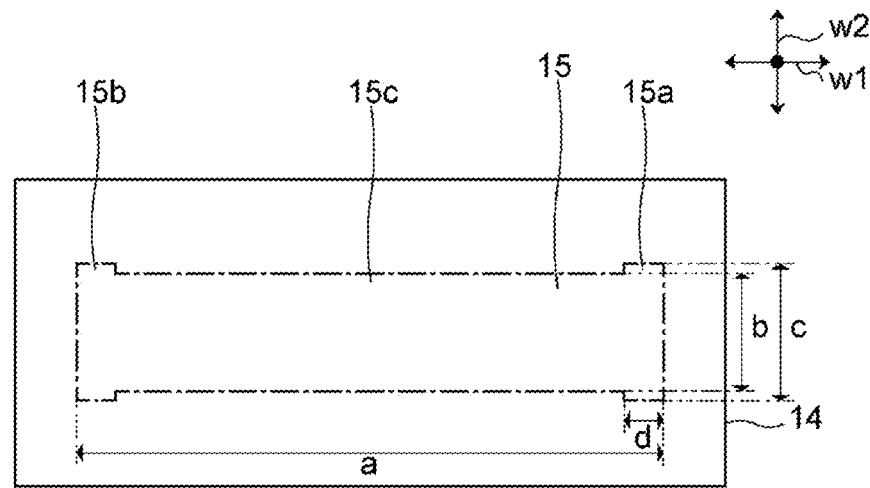
FIG. 5 is a schematic plan view illustrating a membrane portion in the first preferred embodiment of the present invention.

The length a of the membrane portion 15 illustrated in FIG. 5 is preferably equal to or more than about 100 μm and equal to or less than about 700 μm, for example. When a value obtained by dividing the length a of the membrane portion 15 by the width b of the central portion 15c is defined as a length/width ratio, the length/width ratio is preferably equal to or more than about 3 and equal to or less than about 10, for example. In this case, for example, the width b of the central portion 15c is preferably equal to or more than about 10 μm and equal to or less than about 233 μm based on the preferable range of the length a of the membrane portion 15. The length/width ratio may be adjusted in accordance with desired characteristics such as the frequency of the acoustic wave device 10.

The width c of each of the first portion 15a and the second portion 15b is preferably larger than the width b of the central portion 15c by equal to or more than about 2 μm, and more preferably larger by equal to or more than about 8 μm, for example. The length d of each of the first portion 15a and the second portion 15b is preferably equal to or more than about 3 μm, and more preferably equal to or more than about 6 μm, for example. However, an arbitrary value can be applied to the length d of each of the first portion 15a and the second portion 15b in accordance with the design layout.

Hereinafter, a more detailed configuration other than the membrane portion 15 of the present preferred embodiment will be described. As illustrated in FIG. 1, the IDT electrode 11 includes a first busbar 16 and a second busbar 17 to define a pair of busbars, a plurality of first electrode fingers 18, and a plurality of second electrode fingers 19. One ends of the plurality of first electrode fingers 18 each are connected to the first busbar 16. One ends of the plurality of second electrode fingers 19 each are connected to the second busbar 17. The plurality of first electrode fingers 18 and the plurality of second electrode fingers 19 are interdigitated with each other. The IDT electrode 11 may be a multi-layer metal film or a single-layer metal film. Hereinafter, the first electrode fingers 18 and the second electrode fingers 19 may be simply referred to as electrode fingers.

When viewed from the electrode finger facing direction, a region where adjacent electrode fingers overlap each other is an overlap region F. The overlap region F is a region including an electrode finger at one end to an electrode finger at the other end in the electrode finger facing direction of the IDT electrode 11. More specifically, the overlap region F includes from an outer end edge portion of the electrode finger at the above one end in the electrode finger facing direction to an outer end edge portion of the electrode finger at the above other end in the electrode finger facing direction.

Furthermore, the acoustic wave device 10 includes a plurality of excitation regions C. By applying an AC voltage to the IDT electrode 11, acoustic waves are excited in the plurality of excitation regions C. In the present preferred embodiment, the acoustic wave device 10 is configured to be able to use bulk waves in a thickness-shear mode such as a first order thickness-shear mode. Similar to the overlap region F, the excitation region C is a region where adjacent electrode fingers overlap each other when viewed from the electrode finger facing direction. The excitation regions C each are a region between a pair of electrode fingers. More specifically, the excitation region C is a region from the center of one electrode finger in the electrode finger facing direction to the center of the other electrode finger in the electrode finger facing direction. Therefore, the overlap region F includes the plurality of excitation regions C. However, the acoustic wave device 10 may be configured to be able to use plate waves. When the acoustic wave device 10 uses plate waves, the overlap region F is the excitation region.

In the present preferred embodiment, the entire overlap region F overlaps the first region 13d in the cavity portion 13c of the support 13 in a plan view. When a dimension of the cavity portion 13c along a direction parallel or substantially parallel to the second direction w2 is defined as a width of the cavity portion 13c, a width of the second region 13e is narrower than a width of the first region 13d. When a dimension of the overlap region F in the electrode finger extending direction is defined as an overlap width, the width of the second region 13e is narrower than the overlap width.

A pair of through-holes 14c are provided in the piezoelectric layer 14. The through-holes 14c face each other across the overlap region F in a direction parallel or substantially parallel to the electrode finger facing direction. Each of the pair of through-holes 14c extends to the second region 13e of the cavity portion 13c. The through-hole 14c and the first region 13d define an integrated space via the second region 13e. The number and arrangement of the through-holes 14c are not particularly limited. The through-hole 14c does not necessarily have to be provided.

As described above, the cavity portion 13c need not include the second region 13e. When the cavity portion 13c does not include the second region 13e, the through-hole 14c may extend to the first region 13d, for example.

In the first preferred embodiment, the first portion and the second portion have a rectangular or substantially rectangular shape in a plan view. The end edge portion of the membrane portion in the first direction has a linear shape. However, the present invention is not limited thereto. First to fifth modifications of the first preferred embodiment will be described below, which are different from the first preferred embodiment only in the shape of the membrane portion in a plan view. Also in each modification, similar to the first preferred embodiment, it is possible to reduce or prevent the variation in the thickness of the piezoelectric layer.

Figure 10:
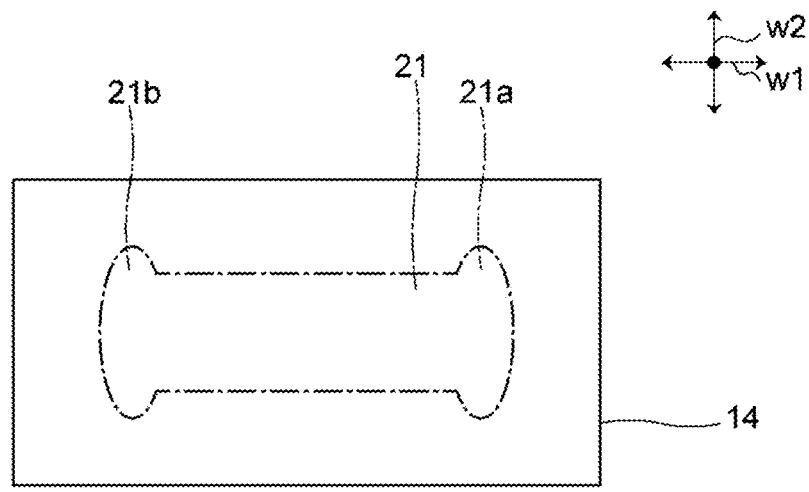
FIG. 10 is a schematic plan view illustrating a membrane portion in a first modification of the first preferred embodiment of the present invention.

In the first modification illustrated in FIG. 10, a first portion 21a and a second portion 21b have an elliptical or substantially elliptical shape in a plan view. An end edge portion of a membrane portion 21 in the first direction w1 has a curved shape.

Figure 11:
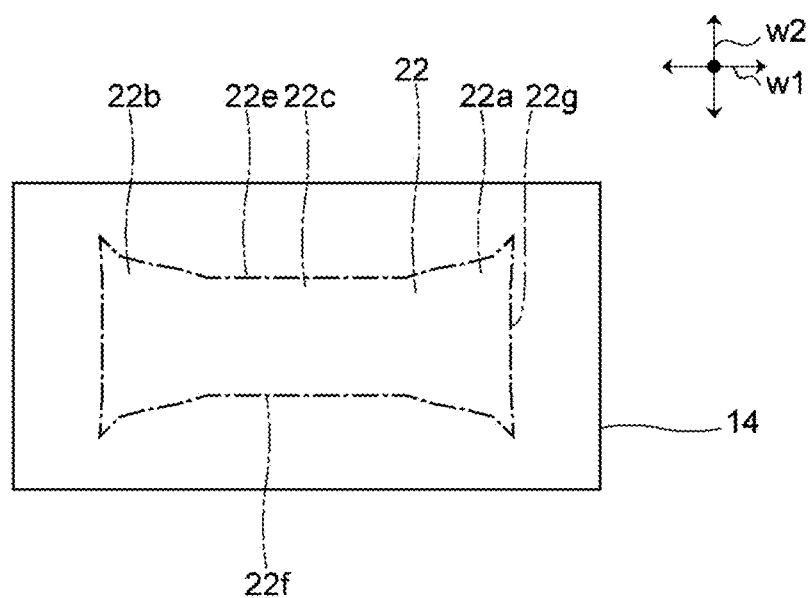
FIG. 11 is a schematic plan view illustrating a membrane portion in a second modification of the first preferred embodiment of the present invention.

In the second modification illustrated in FIG. 11, a membrane portion 22 has a drum shape or an hourglass shape in a plan view. A first portion 22a and a second portion 22b have a trapezoidal or substantially trapezoidal shape. In the first portion 22a and the second portion 22b, the width of the membrane portion 22 changes. To be specific, in the first portion 22a and the second portion 22b, a first outer peripheral edge portion 22e and a second outer peripheral edge portion 22f extend toward the outer side portion in the second direction w2 as they approach both end edge portions in the first direction w1.

Both of the end edge portions in the first direction w1 of the membrane portion 22 each include a recess 22g. The bottom portion of the recess 22g at each end edge portion is located in the center and around the center in the second direction w2 of the membrane portion 22. In an outer peripheral edge of the membrane portion 22, four corner portions in a plan view are the outermost portions located in both of the first direction w1 and the second direction w2. However, both end edge portions need not include the recess 22g. The entirety of both end edge portions may extend linearly in the second direction w2.

The width of the membrane portion 22 also changes in portions other than the first portion 22a and the second portion 22b. In the portions where the width varies, the width increases from the central portion 22c side toward the first portion 22a side or the second portion 22b side. In the portions where the width varies, both of the first outer peripheral edge portion 22e and the second outer peripheral edge portion 22f are inclined with respect to the first direction w1. On the other hand, the widths of the central portion 22c and its periphery are constant or substantially constant.

In the present modification, the inclination angles of the first outer peripheral edge portion 22e and the second outer peripheral edge portion 22f with respect to the first direction w1 change three times, for example. More specifically, for example, after the inclination angle becomes larger than 0°, the inclination angle becomes smaller by one degree and then becomes larger. How the inclination angle changes and the number of changes are not limited to the above. For example, the inclination angle may be constant after the inclination angle becomes larger than 0°.

Figure 12:
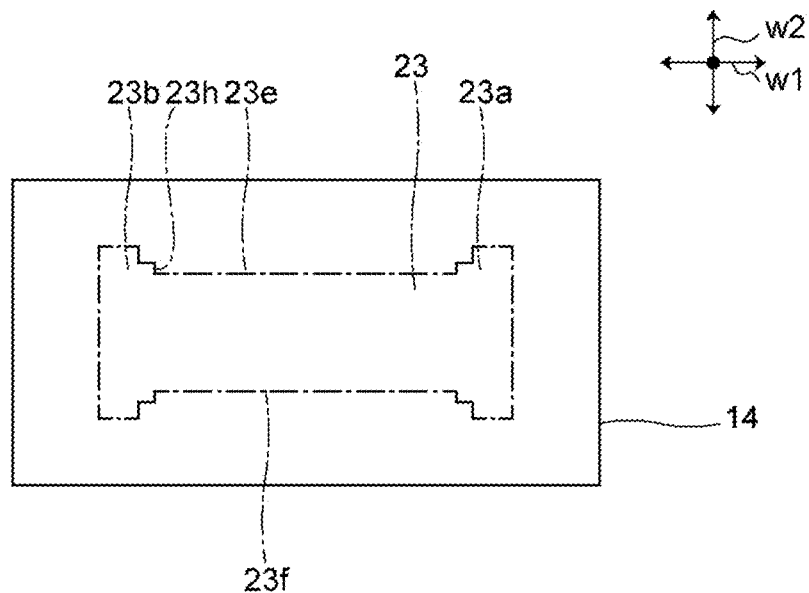
FIG. 12 is a schematic plan view illustrating a membrane portion in a third modification of the first preferred embodiment of the present invention.

The third modification illustrated in FIG. 12 is different from the first preferred embodiment in that a membrane portion 23 includes a step portion 23h in the vicinity of a first portion 23a and in the vicinity of a second portion 23b. The width of the membrane portion 23 varies with the step portion 23h as a boundary. To be more specific, in the first direction w1, the width of a portion on the outer side relative to the step portion 23h is wider than the width of a portion on the inner side. As a result, the width of the membrane portion 23 increases stepwise toward the first portion 23a or the second portion 23b. In the present modification, the step portion 23h is provided in each of a portion located in the vicinity of the first portion 23a and a portion located in the vicinity of the second portion 23b in a first outer peripheral edge portion 23e and a second outer peripheral edge portion 23f. The number of locations where the step portion 23h is provided is not particularly limited.

Figure 13:
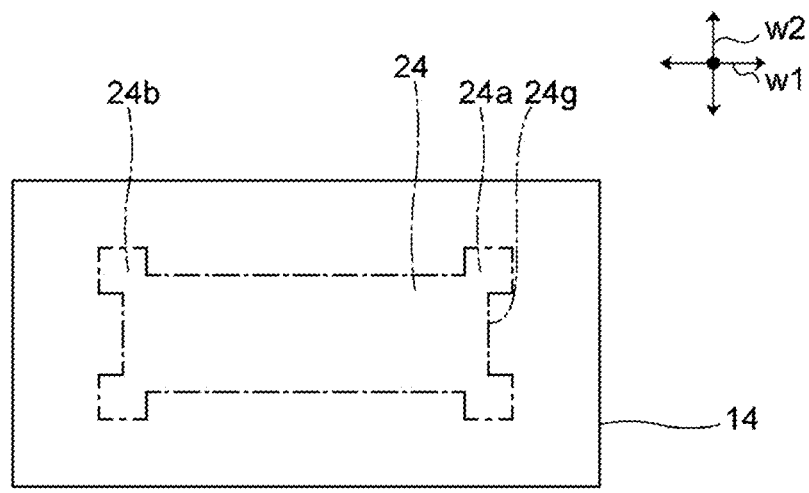
FIG. 13 is a schematic plan view illustrating a membrane portion in a fourth modification of the first preferred embodiment of the present invention.

The fourth modification illustrated in FIG. 13 is different from the first preferred embodiment in that both end edge portions in the first direction w1 of a membrane portion 24 include a recess 24g. The shape of a first portion 24a of the present modification in a plan view is a shape in which rectangular or substantially rectangular portions protruding in both the first direction w1 and the second direction w2 are provided at two corner portions of a rectangle. The same applies to the shape of a second portion 24b. The protruding portions in the first portion 24a and the second portion 24b may be a polygonal shape other than a rectangular or substantially rectangular shape. In this specification, the polygonal shape includes a shape in which the corner portion is curved.

Figure 14:
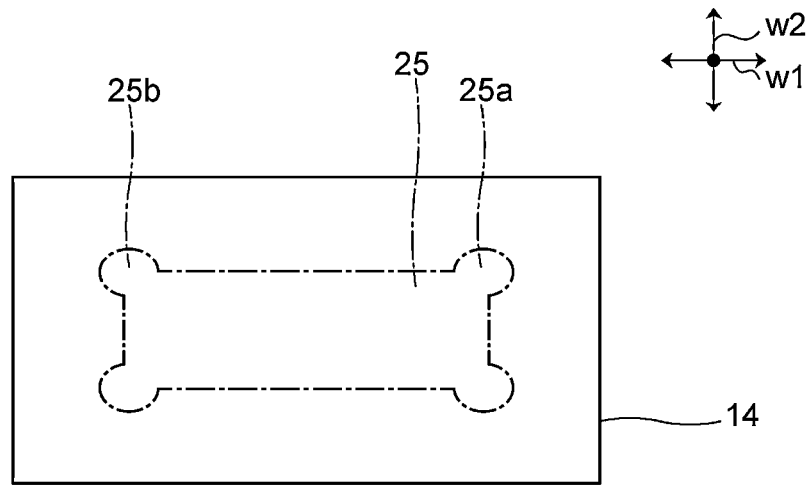
FIG. 14 is a schematic plan view illustrating a membrane portion in a fifth modification of the first preferred embodiment of the present invention.

The fifth modification illustrated in FIG. 14 is different from the fourth modification in the shapes of a first portion 25a and a second portion 25b of a membrane portion 25. To be more specific, the shape of the first portion 25a of the present modification in a plan view is a shape in which circular or substantially circular portions protruding in both of the first direction w1 and the second direction w2 are provided at two corner portions of a rectangle. The same applies to the shape of the second portion 25b. The shape of the protruding portions in the first portion 25a and the second portion 25b may be an elliptical or substantially elliptical shape or an appropriate shape provided by connecting curved lines.

The configurations of the first to fifth modifications can be applied to configurations of the present invention other than the first preferred embodiment.

Figure 15:
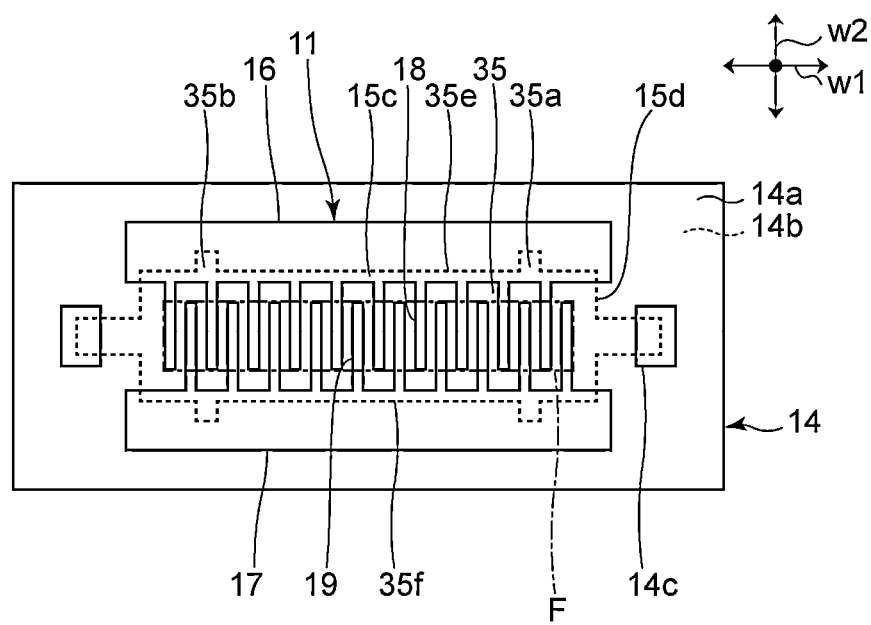
FIG. 15 is a schematic plan view of an acoustic wave device according to a second preferred embodiment of the present invention.

FIG. 15 is a schematic plan view of an acoustic wave device according to a second preferred embodiment of the present invention.

The present preferred embodiment is different from the first preferred embodiment in the positions of a first portion 35a and a second portion 35b of a membrane portion 35. Except for the above-described points, the acoustic wave device of the second preferred embodiment has the same or substantially the same configuration as that of the acoustic wave device 10 of the first preferred embodiment.

Each of the first portion 35a and the second portion 35b is located on the inner side relative to an end portion of the membrane portion 35 in the first direction w1. Thus, each of the first portion 35a and the second portion 35b does not include an end edge portion in the first direction w1.

In the present preferred embodiment, a portion of each of the first portion 35a and the second portion 35b is included in the overlap region F. To be more specific, a plurality of electrode fingers is located in an outer side portion relative to the first portion 35a in the first direction w1. It is sufficient that at least one electrode finger is located in the outer side portion relative to the first portion 35a in the first direction w1. Similarly, the plurality of electrode fingers is located in the outer side portion relative to the second portion 35b in the first direction w1. At least one electrode finger may be located in the outer side portion relative to the second portion 35b in the first direction w1.

However, each of the first portion 35a and the second portion 35b need not include the end edge portion in the first direction w1 and may be located between the end portion in the first direction w1 and the overlap region F.

Also in the present preferred embodiment, the respective portions located in the first portion 35a and the second portion 35b in an outer peripheral edge of the membrane portion 35 are located on the outer side in the second direction w2 relative to the portion located in the central portion 15c in the outer peripheral edge. As such, similar to the first preferred embodiment, variations in the thickness of the piezoelectric layer 14 can be reduced or prevented.

As illustrated in FIG. 15, an entire first outer peripheral edge portion 35e of the membrane portion 35 overlaps the first busbar 16 of the IDT electrode 11 in a plan view. Meanwhile, an entire second outer peripheral edge portion 35f overlaps the second busbar 17 in a plan view. Therefore, the first portion 35a and the second portion 35b do not extend to an outer side portion of the first busbar 16 and the second busbar 17 in the second direction w2. At least a portion of the first outer peripheral edge portion 35e and the second outer peripheral edge portion 35f need not overlap any of the pair of busbars in a plan view. This example is illustrated by the following third preferred embodiment.

Figure 16:
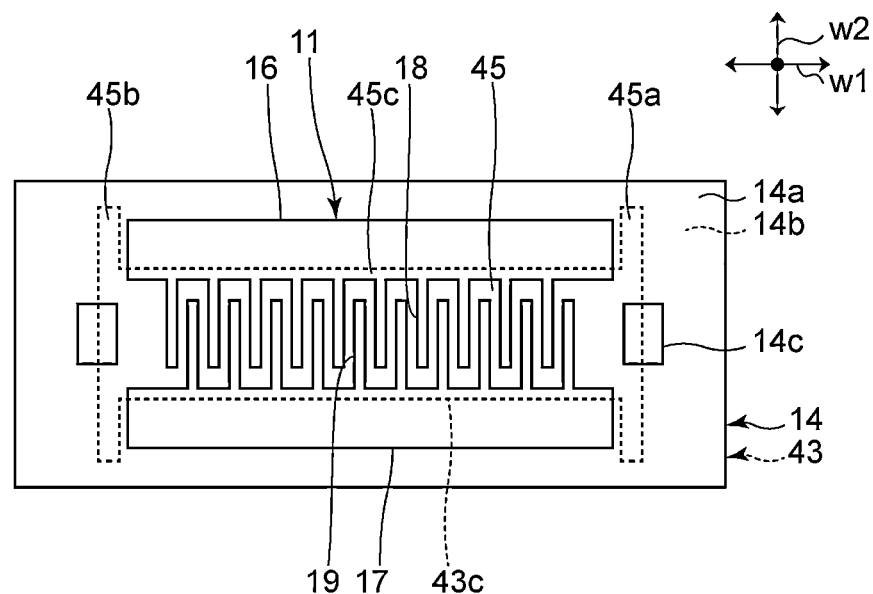
FIG. 16 is a schematic plan view of an acoustic wave device according to a third preferred embodiment of the present invention.

FIG. 16 is a schematic plan view of an acoustic wave device according to a third preferred embodiment of the present invention.

The present preferred embodiment is different from the first preferred embodiment in the configurations of a cavity portion 43c of a support 43 and a membrane portion 45. Except for the above-described points, the acoustic wave device of the present preferred embodiment has the same or substantially the same configuration as that of the acoustic wave device 10 of the first preferred embodiment.

In the present preferred embodiment, the cavity portion 43c does not include the second region. Further, the cavity portion 43c extends to an outer side portion of the IDT electrodes 11 in the first direction w1. That is, both end portions of the cavity portion 43c in the first direction w1 extend to the outer side portion of the first busbar 16 and the second busbar 17 in the first direction w1. Furthermore, as illustrated in FIG. 16, both end portions extend to the outer side portion of the first busbar 16 and the second busbar 17 in the second direction w2.

A first portion 45a and a second portion 45b of the membrane portion 45 respectively overlap both end portions of the cavity portion 43c in the first direction w1 in a plan view. Thus, the respective first portion 45a and the second portion 45b are located in the outer side portion of the first busbar 16 and the second busbar 17 in the first direction w1. Further, the respective first portion 45a and the second portion 45b extend to the outer side portion of the first busbar 16 and the second busbar 17 in the second direction w2.

As described above, the cavity portion 43c does not include the second region. In the present preferred embodiment, a portion of one through-hole 14c of the piezoelectric layer 14 is provided in the first portion 45a of the membrane portion 45. A portion of the other through-hole 14c is provided in the second portion 45b. However, the position of the through-hole 14c is not limited to those described above.

Also in the membrane portion 45 of the present preferred embodiment, the respective portions located in the first portion 45a and the second portion 45b in the outer peripheral edge are located in the outer side portion in the second direction w2 relative to the portion located in the central portion 45c in the outer peripheral edge. As such, similar to the first preferred embodiment, variation in the thickness of the piezoelectric layer 14 can be reduced or prevented.

Figure 17:
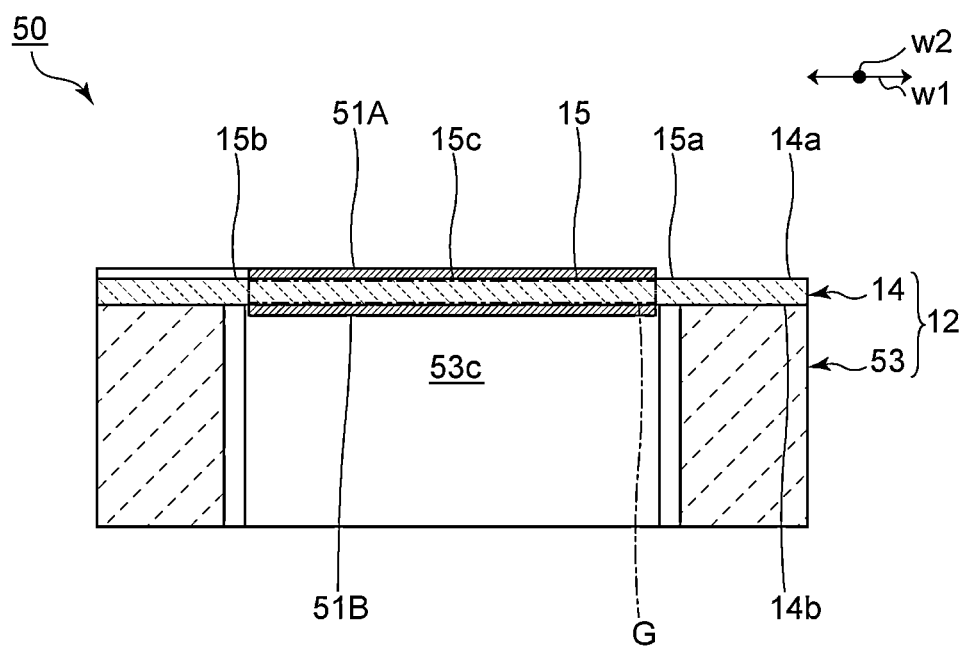
FIG. 17 is a schematic elevational cross-sectional view of an acoustic wave device according to a fourth preferred embodiment of the present invention.
Figure 18:
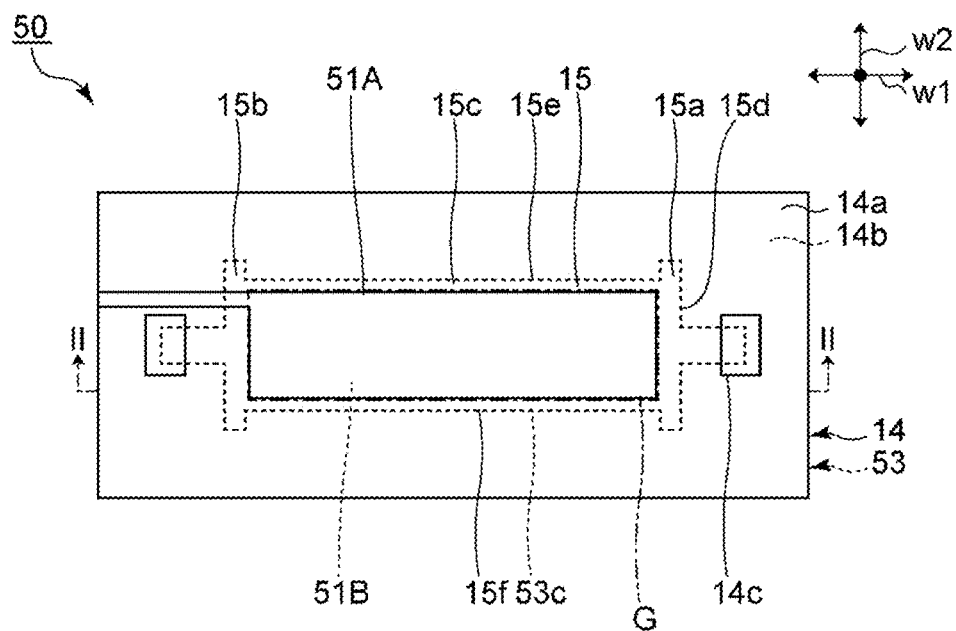
FIG. 18 is a schematic plan view of an acoustic wave device according to the fourth preferred embodiment of the present invention.

FIG. 17 is a schematic elevational cross-sectional view of an acoustic wave device according to a fourth preferred embodiment of the present invention. FIG. 18 is a schematic plan view of the acoustic wave device according to the fourth preferred embodiment. FIG. 17 is a cross-sectional view taken along line II-II in FIG. 18.

As illustrated in FIG. 17, the present preferred embodiment is different from the first preferred embodiment in that an excitation electrode includes an upper electrode 51A and a lower electrode 51B. An acoustic wave device 50 is a bulk acoustic wave (BAW) element. Further, the present preferred embodiment is also different from the first preferred embodiment in that a cavity portion 53c of a support 53 is a through-hole provided in the support 53. Except for the above-described points, the acoustic wave device 50 of the present preferred embodiment has the same or substantially the same configuration as that of the acoustic wave device 10 of the first preferred embodiment.

The upper electrode 51A is provided on the first main surface 14a of the piezoelectric layer 14. The lower electrode 51B is provided on the second main surface 14b of the piezoelectric layer 14. The upper electrode 51A and the lower electrode 51B face each other across the piezoelectric layer 14. The upper electrode 51A and the lower electrode 51B are connected to potentials different from each other. As illustrated in FIG. 17 and FIG. 18, a region where the upper electrode 51A and the lower electrode 51B face each other is a facing region G. In the present preferred embodiment, the excitation region is located in the facing region G. The cavity portion 53c of the support 53 overlaps the excitation region in a plan view. Thus, at least a portion of the upper electrode 51A and the lower electrode 51B overlaps the cavity portion 53c in a plan view.

In the present preferred embodiment, the membrane portion 15 is configured in the same or substantially the same manner as the first preferred embodiment. As such, variations in the thickness of the piezoelectric layer 14 can be reduced or prevented.

Hereinafter, an acoustic wave device that uses bulk waves in the thickness-shear mode will be described in detail. The support below corresponds to the above support substrate.

Figure 19A:
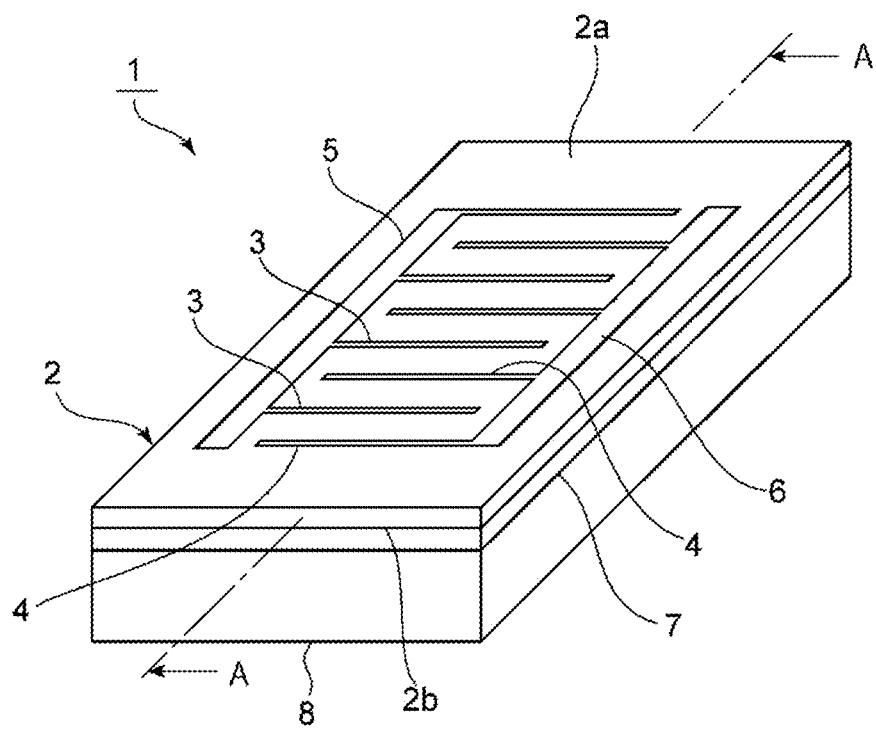
FIG. 19A is a schematic perspective view illustrating an appearance of an acoustic wave device using bulk waves in a thickness-shear mode.
Figure 19B:
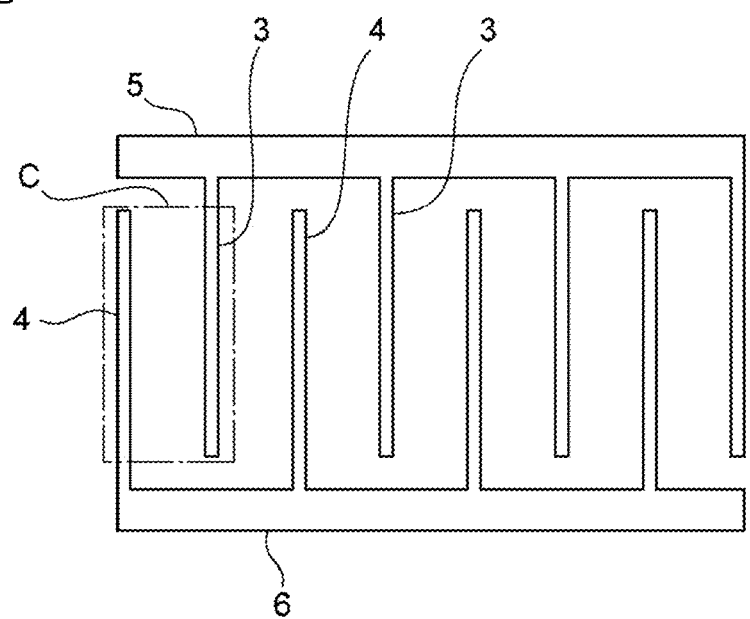
FIG. 19B is a plan view illustrating an electrode structure on a piezoelectric layer.
Figure 20:
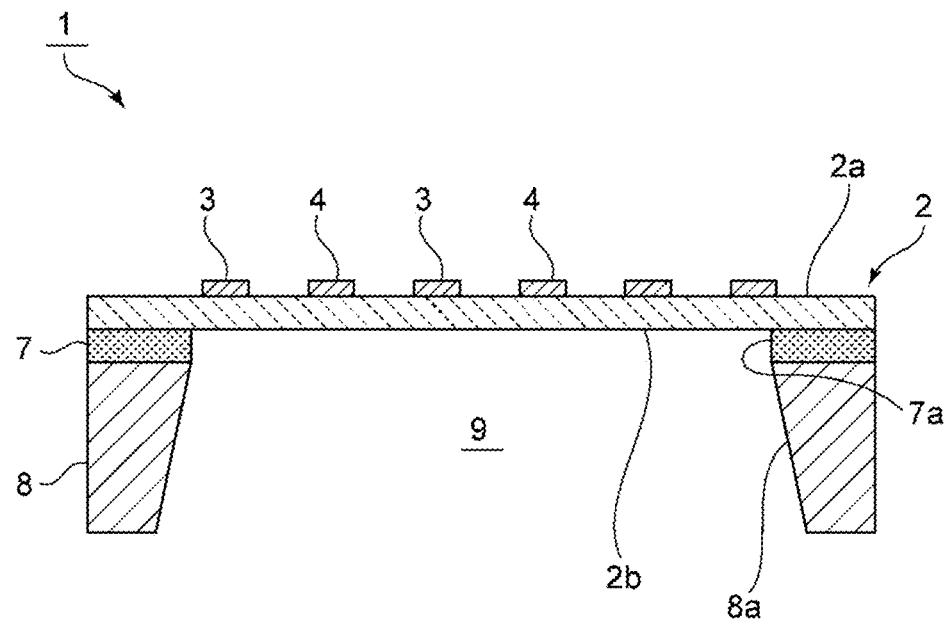
FIG. 20 is a cross-sectional view of a portion taken along line A-A in FIG. 19A.

FIG. 19A is a schematic perspective view illustrating an appearance of an acoustic wave device using bulk waves in the thickness-shear mode, FIG. 19B is a plan view illustrating an electrode structure on a piezoelectric layer, and FIG. 20 is a cross-sectional view of a portion taken along line A-A in FIG. 19A.

An acoustic wave device 1 includes a piezoelectric layer 2 made of, for example, $LiNbO_3$. The piezoelectric layer 2 may be made of, for example, $LiTaO_3$. A cut angle of $LiNbO_3$ and $LiTaO_3$ is Z-cut, but may be rotated Y-cut or X-cut. In order to effectively excite the thickness-shear mode, the thickness of the piezoelectric layer 2 is, but is not particularly limited, preferably equal to or more than about 40 nm and equal to or less than about 1000 nm, and more preferably equal to or more than about 50 nm and equal to or less than about 1000 nm, for example. The piezoelectric layer 2 includes first and second main surfaces 2a and 2b facing each other. An electrode 3 and an electrode 4 are provided on the first main surface 2a. Here, the electrode 3 is an example of a "first electrode", and the electrode 4 is an example of a "second electrode". In FIGS. 19A and 19B, the plurality of electrodes 3 are connected to a first busbar 5. The plurality of electrodes 4 are connected to a second busbar 6. The plurality of electrodes 3 and the plurality of electrodes 4 are interdigitated with each other. The electrode 3 and the electrode 4 have a rectangular or substantially rectangular shape and extend in a length direction. The electrode 3 and the adjacent electrode 4 face each other in a direction orthogonal or substantially orthogonal to the length direction. The length direction of the electrodes 3 and 4 and the direction orthogonal or substantially orthogonal to the length direction of the electrodes 3 and 4 each are a direction intersecting a thickness direction of the piezoelectric layer 2. Therefore, it can also be said that the electrode 3 and the adjacent electrode 4 face each other in the direction intersecting the thickness direction of the piezoelectric layer 2. In addition, the length direction of the electrodes 3 and 4 may be replaced with the direction orthogonal or substantially orthogonal to the length direction of the electrodes 3 and 4 illustrated in FIGS. 19A and 19B. That is, in FIGS. 19A and 19B, the electrodes 3 and 4 may extend in a direction in which the first busbar 5 and the second busbar 6 extend. In this case, the first busbar 5 and the second busbar 6 extend in a direction in which the electrodes 3 and 4 extend in FIGS. 19A and 19B. A plurality of pairs of structures in which the electrode 3 connected to one potential and the electrode 4 connected to the other potential are adjacent to each other is provided in the direction orthogonal or substantially orthogonal to the length direction of the above electrodes 3 and 4. Here, the electrode 3 and the electrode 4 being adjacent to each other refers not to a case where the electrode 3 and the electrode 4 are arranged so as to be in direct contact with each other but to a case where the electrode 3 and the electrode 4 are arranged with an interval therebetween. In addition, when the electrode 3 and the electrode 4 are adjacent to each other, an electrode connected to a hot electrode or a ground electrode, including the other electrodes 3 and 4, is not arranged between the electrode 3 and the electrode 4. The number of pairs need not be integer pairs, but may be, for example, 1.5 pairs, 2.5 pairs, and the like. A center-to-center distance between the electrodes 3 and 4, that is, a pitch is preferably in a range of equal to or more than about 1 μm and equal to or less than about 10 μm, for example. In addition, the width of the electrodes 3 and 4, that is, a dimension of the electrodes 3 and 4 in a facing direction is preferably in a range of equal to or more than about 50 nm and equal to or less than about 1000 nm, and more preferably in a range of equal to or more than about 150 nm and equal to or less than about 1000 nm, for example. The center-to-center distance between the electrodes 3 and 4 is a distance when connecting the center of the dimension (width dimension) of the electrode 3 in the direction orthogonal or substantially orthogonal to the length direction of the electrode 3 and the center of the dimension (width dimension) of the electrode 4 in the direction orthogonal or substantially orthogonal to the length direction of the electrode 4.

In addition, since the acoustic wave device 1 uses a Z-cut piezoelectric layer, the direction orthogonal or substantially orthogonal to the length direction of the electrodes 3 and 4 is orthogonal or substantially orthogonal to a polarization direction of the piezoelectric layer 2. This does not apply when a piezoelectric body having another cut angle is used as the piezoelectric layer 2. Here, "orthogonal" is not limited to be strictly orthogonal but may be substantially orthogonal (an angle formed by the direction orthogonal to the length direction of the electrodes 3 and 4 and the polarization direction is within a range of about 90°±10°, for example).

A support 8 is stacked on the second main surface 2b side of the piezoelectric layer 2 via an insulating layer 7. The insulating layer 7 and the support 8 have a frame shape, and include through-holes 7a and 8a as illustrated in FIG. 20. Thus, a cavity portion 9 is provided. The cavity portion 9 is provided so as not to interfere with the vibration of the excitation region C of the piezoelectric layer 2. Therefore, the support 8 is stacked on the second main surface 2b via the insulating layer 7 at a position not overlapping a portion in which at least a pair of electrodes 3 and 4 are provided. The insulating layer 7 need not be provided. Therefore, the support 8 can be directly or indirectly stacked on the second main surface 2b of the piezoelectric layer 2.

The insulating layer 7 is made of, for example, silicon oxide. However, in addition to silicon oxide, an appropriate insulating material such as, for example, silicon oxynitride, alumina or the like may be used. The support 8 is made of, for example, Si. A plane orientation of the surface of Si on the piezoelectric layer 2 side may be (100), (110), or (111). It is preferable that Si of the support 8 has a high resistance with resistivity of equal to or higher than about 4 kΩcm, for example. However, the support 8 can also be made using an appropriate insulating material or semiconductor material.

As the material for the support 8, for example, piezoelectric bodies such as, for example, aluminum oxide, lithium tantalate, lithium niobate, crystal and the like; various ceramics such as, for example, alumina, magnesia, sapphire, silicon nitride, aluminum nitride, silicon carbide, zirconia, cordierite, mullite, steatite, forsterite and the like; dielectrics such as, for example, diamond, glass and the like; and semiconductors such as, for example, gallium nitride can be used.

The plurality of electrodes 3 and 4 and the first and second busbars 5 and 6 described above are made of an appropriate metal or alloy such as, for example, Al, an AlCu alloy or the like. In the present preferred embodiment, for example, the electrodes 3 and 4 and the first and second busbars 5 and 6 have a structure in which an Al film is stacked on a Ti film. A close contact layer other than the Ti film may be used.

At the time of driving, an AC voltage is applied between the plurality of electrodes 3 and the plurality of electrodes 4. More specifically, the AC voltage is applied between the first busbar 5 and the second busbar 6. As such, it is possible to obtain resonance characteristics when using bulk waves in the thickness-shear mode excited in the piezoelectric layer 2. In addition, for example, in the acoustic wave device 1, when the thickness of the piezoelectric layer 2 is defined as d and the center-to-center distance between any adjacent electrodes 3 and 4 of the plurality of pairs of electrodes 3 and 4 is defined as p, d/p is considered to be equal to or less than about 0.5. Therefore, the bulk waves in the thickness-shear mode described above are effectively excited, and good resonance characteristics can be obtained. More preferably, d/p is equal to or less than about 0.24, for example, in which case even better resonance characteristics can be obtained.

Since the acoustic wave device 1 has the above-described configuration, even when the number of pairs of the electrodes 3 and 4 is reduced in order to achieve a reduction in size, a Q value is less likely to decrease. This is because propagation loss is small even when the number of electrode fingers in reflectors on both sides is reduced. In addition, the number of electrode fingers can be reduced because bulk waves in the thickness-shear mode are used. The difference between the Lamb waves used in the acoustic wave device and the bulk waves in the thickness-shear mode above will be described with reference to FIGS. 21A and 21B.

Figure 21A:
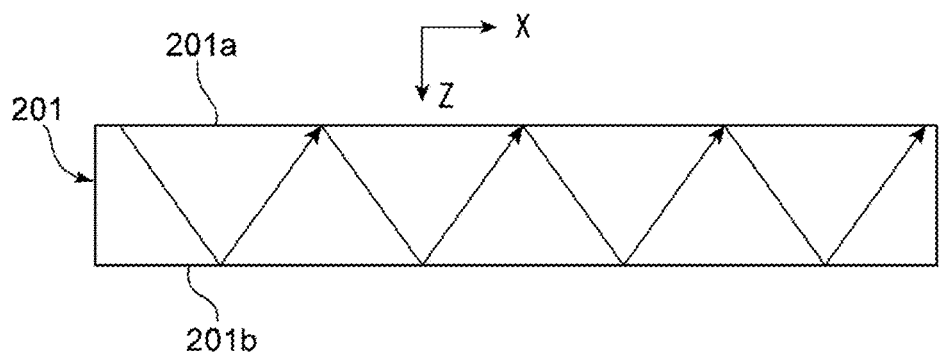
FIG. 21A is a schematic elevational cross-sectional view for explaining Lamb waves propagating through a piezoelectric film of an acoustic wave device.

FIG. 21A is a schematic elevational cross-sectional view for explaining Lamb waves propagating through a piezoelectric film of an acoustic wave device as described in Japanese Unexamined Patent Application Publication No. 2012-257019. Here, waves propagate through a piezoelectric film 201 as indicated by arrows. Here, in the piezoelectric film 201, a first main surface 201a and a second main surface 201b face each other, and the thickness direction connecting the first main surface 201a and the second main surface 201b is a Z-direction. An X-direction is a direction in which the electrode fingers of the IDT electrode are arranged. As illustrated in FIG. 21A, the wave of Lamb waves propagates in the X-direction. Although the piezoelectric film 201 vibrates as a whole because of the plate waves, since the waves propagate in the X-direction, reflectors are arranged on both sides to obtain resonance characteristics. Therefore, the propagation loss of waves occurs, and the Q value decreases when the size is reduced, that is, when the number of pairs of electrode fingers is reduced.

Figure 21B:
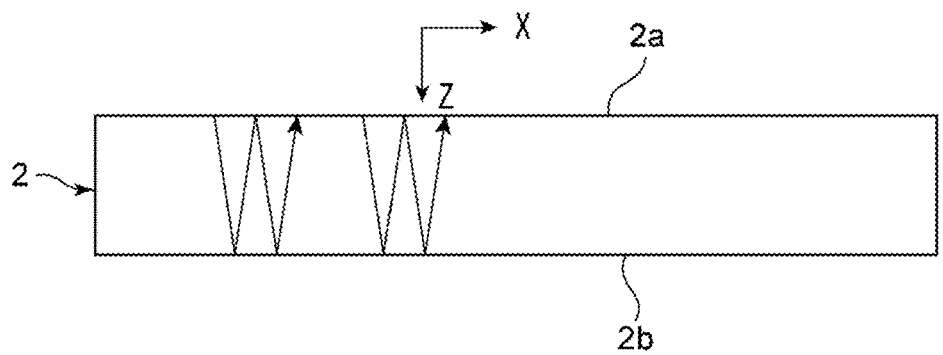
FIG. 21B is a schematic elevational cross-sectional view for explaining bulk waves in the thickness-shear mode propagating through the piezoelectric film in the acoustic wave device.

On the other hand, as illustrated in FIG. 21B, in the acoustic wave device 1, since the vibration displacement is in a thickness-shear direction, the wave propagates substantially in the direction connecting the first main surface 2a and the second main surface 2b of the piezoelectric layer 2, that is, in the Z-direction, and resonates. That is, the X-direction component of the wave is significantly smaller than the Z-direction component. Since resonance characteristics are obtained by the propagation of the wave in the Z-direction, the propagation loss is less likely to occur even when the number of electrode fingers of the reflector is reduced. Furthermore, even when the number of electrode pairs including the electrodes 3 and 4 is reduced in order to reduce the size, the Q value is less likely to decrease.

Figure 22:
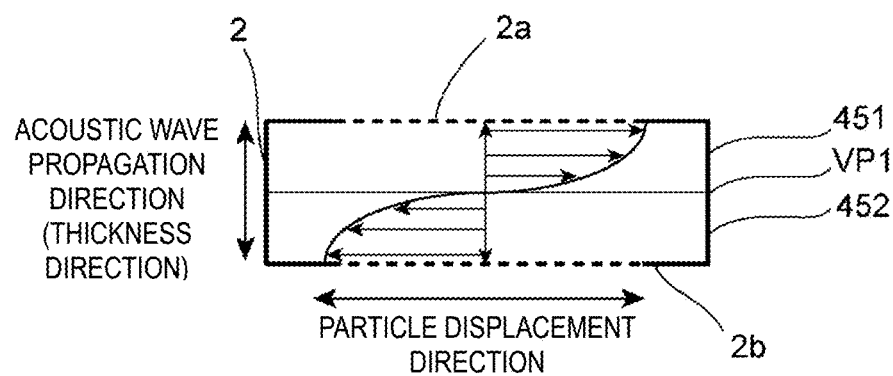
FIG. 22 is a diagram illustrating an amplitude direction of bulk waves in the thickness-shear mode.

As illustrated in FIG. 22, amplitude directions of the bulk waves in the thickness-shear mode are opposite from each other in a first region 451 included in the excitation region C of the piezoelectric layer 2 and a second region 452 included in the excitation region C. FIG. 22 schematically illustrates bulk waves when a voltage is applied between the electrode 3 and the electrode 4 so that the electrode 4 has a higher potential than the electrode 3. The first region 451 is a region of the excitation region C between the first main surface 2a and a virtual plane VP1 that is orthogonal to the thickness direction of the piezoelectric layer 2 and divides the piezoelectric layer 2 into two parts. The second region 452 is a region of the excitation region C between the virtual plane VP1 and the second main surface 2b.

As described above, in the acoustic wave device 1, at least one pair of electrodes including the electrode 3 and the electrode 4 is arranged. However, since waves are not propagated in the X-direction, the number of pairs of electrodes including the electrodes 3 and 4 does not need to be plural. That is, at least one pair of electrodes need only be provided.

For example, the electrode 3 is an electrode connected to the hot potential, and the electrode 4 is an electrode connected to the ground potential. However, the electrode 3 may be connected to the ground potential and the electrode 4 may be connected to the hot potential. In the present preferred embodiment, as described above, at least one pair of electrodes is an electrode connected to the hot potential or an electrode connected to the ground potential, and a floating electrode is not provided.

Figure 23:
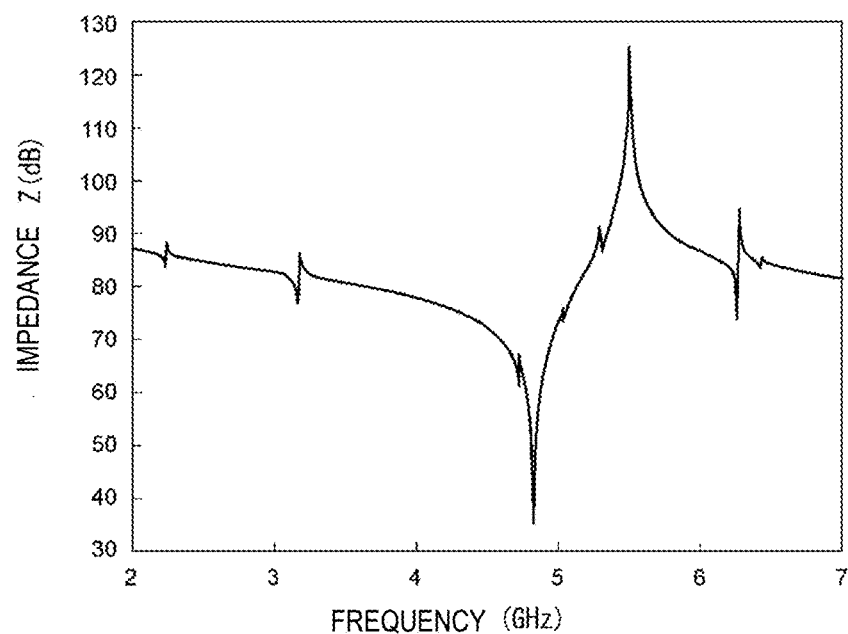
FIG. 23 is a graph illustrating resonance characteristics of the acoustic wave device using bulk waves in the thickness-shear mode.

FIG. 23 is a graph illustrating resonance characteristics of the acoustic wave device illustrated in FIG. 20. The design parameters of the acoustic wave device 1 having this resonance characteristics are as follows.

Piezoelectric layer 2: LiNbO$_3$ with Euler angles (0°, 0°, 90°), thickness=about 400 nm.

When viewed in a direction orthogonal or substantially orthogonal to the length direction of the electrode 3 and the electrode 4, a region where the electrode 3 and the electrode 4 overlap, that is, the length of the excitation region C=about 40 µm, the number of pairs of electrodes composed of the electrodes 3 and 4=21 pairs, the distance between the centers of the electrodes=about 3 µm, the width of the electrodes 3 and 4=about 500 nm, d/p=about 0.133.

Insulating layer 7: silicon oxide film with a thickness of about 1 µm.

Support 8: Si.

The length of the excitation region C is a dimension of the excitation region C along the length direction of the electrodes 3 and 4.

In the present preferred embodiment, the electrode distances of the electrode pairs including the electrodes 3 and 4 were all made equal or substantially equal in a plurality of pairs. That is, the electrodes 3 and the electrodes 4 were arranged at equal or substantially equal pitches.

As is clear from FIG. 23, good resonance characteristics with a fractional bandwidth of about 12.5% is obtained even though no reflector is provided.

When the thickness of the piezoelectric layer 2 is defined as d and the center-to-center distance between the electrode 3 and the electrode 4 is defined as p, for example, d/p is equal to or less than about 0.5 and more preferably equal to or less than about 0.24 in the present preferred embodiment as described above. This will be described with reference to FIG. 24.

Figure 24:
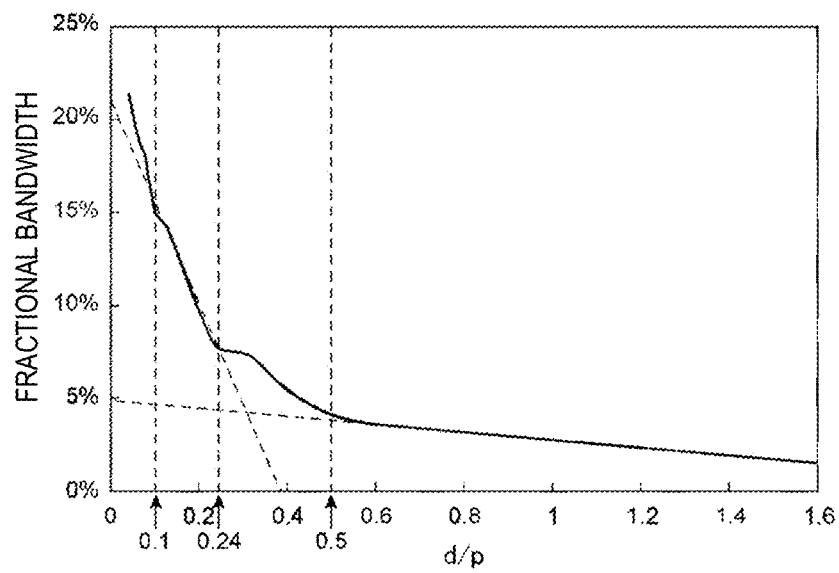
FIG. 24 is a graph illustrating a relationship between d/p and a fractional bandwidth as a resonator, when p is a center-to-center distance between adjacent electrodes and d is the thickness of the piezoelectric layer.

A plurality of acoustic wave devices were obtained in the same manner as the acoustic wave device having the resonance characteristics illustrated in FIG. 23 except that d/p was changed. FIG. 24 is a graph illustrating a relationship between d/p and the fractional bandwidth as a resonator of the acoustic wave device.

As is clear from FIG. 24, when d/p>about 0.5, the fractional bandwidth is less than about 5% even when d/p is adjusted. On the other hand, in the case of d/p≤about 0.5, by changing d/p within the range, the fractional bandwidth can be set to equal to or more than about 5%, that is, a resonator having a high coupling coefficient can be formed. Further, in the case where d/p is equal to or less than about 0.24, the fractional bandwidth can be increased to equal to or more than about 7%. In addition, when d/p is adjusted within this range, a resonator having a wider fractional bandwidth can be obtained, and a resonator having a higher coupling coefficient can be obtained. Therefore, it is understood that by setting d/p to equal to or less than about 0.5, a resonator with a high coupling coefficient using the bulk waves in the above thickness-shear mode can be provided.

Figure 25:
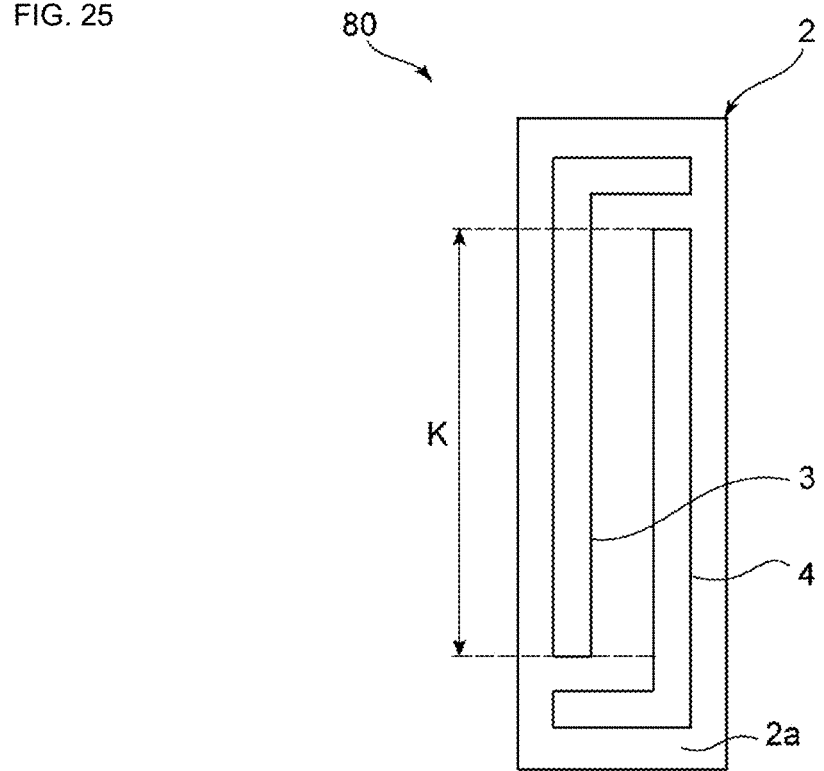
FIG. 25 is a plan view of an acoustic wave device using bulk waves in the thickness-shear mode.

FIG. 25 is a plan view of an acoustic wave device using bulk waves in the thickness-shear mode. In an acoustic wave device 80, a pair of electrodes having the electrode 3 and the electrode 4 are provided on the first main surface 2a of the piezoelectric layer 2. K in FIG. 25 is an overlap width. As described above, in an acoustic wave device according to a preferred embodiment of the present invention, the number of pairs of electrodes may be one. Also in this case, when d/p above is equal to or less than about 0.5, the bulk waves in the thickness-shear mode can be effectively excited.

Figure 26:
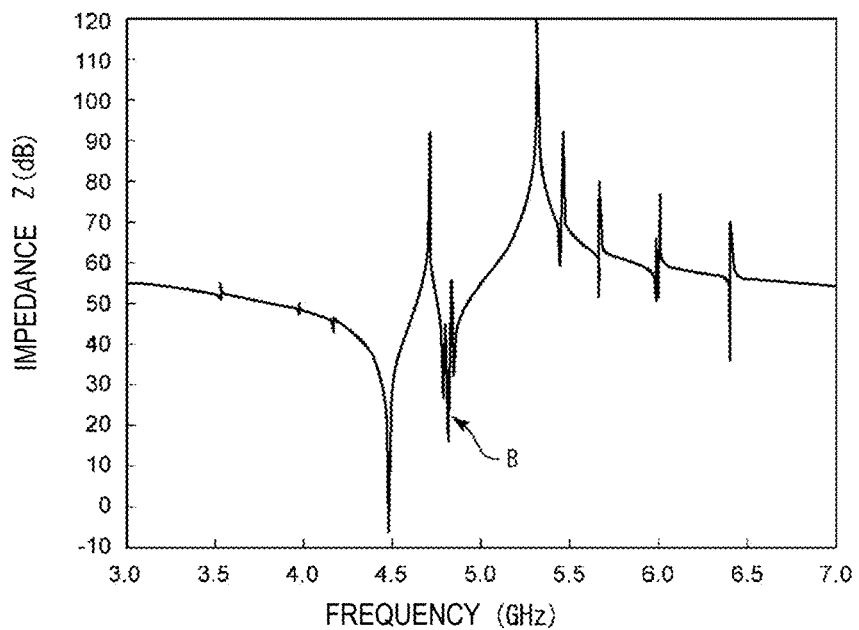
FIG. 26 is a graph illustrating resonance characteristics of an acoustic wave device of a reference example in which a spurious emission appears.

In the acoustic wave device 1, when viewed in a direction in which any adjacent electrodes 3 and 4 in the plurality of electrodes 3 and 4 face each other, it is preferable that a metallization ratio MR of the above adjacent electrodes 3 and 4 with respect to the excitation region C, which is the overlapping region, satisfy MR≤1.75 (d/p)+0.075. In this case, a spurious emission can be effectively reduced. This will be described with reference to FIG. 26 and FIG. 27. FIG. 26 is a reference graph illustrating an example of resonance characteristics of the above acoustic wave device 1. A spurious emission indicated by an arrow B appears between the resonant frequency and the anti-resonant frequency. It is noted that d/p=about 0.08 and $LiNbO_3$ with Euler angles (0°, 0°, 90°) were set. In addition, the above metallization ratio MR was set to MR=about 0.35.

The metallization ratio MR will be described with reference to FIG. 19B. When attention is directed to the pair of electrodes 3 and 4 in the electrode structure of FIG. 19B, it is assumed that only the pair of electrodes 3 and 4 is provided. In this case, a portion surrounded by an alternate long and short dash line is the excitation region C. The excitation region C is, when the electrode 3 and the electrode 4 are viewed in a direction orthogonal or substantially orthogonal to the length direction of the electrodes 3 and 4, that is, in the facing direction, a region overlapping the electrode 4 in the electrode 3, a region overlapping the electrode 3 in the electrode 4, and a region where the electrode 3 and the electrode 4 overlap each other in a region between the electrode 3 and the electrode 4. An area of the electrodes 3 and 4 in the excitation region C with respect to an area of the excitation region C is the metallization ratio MR. That is, the metallization ratio MR is the ratio of an area of the metallization portion with respect to the area of the excitation region C.

When a plurality of pairs of electrodes are provided, the rate of the metallization portion included in the entire excitation region with respect to the total areas of the excitation regions may be defined as MR. All of the excitation regions may be collectively referred to as one excitation region.

Figure 27:
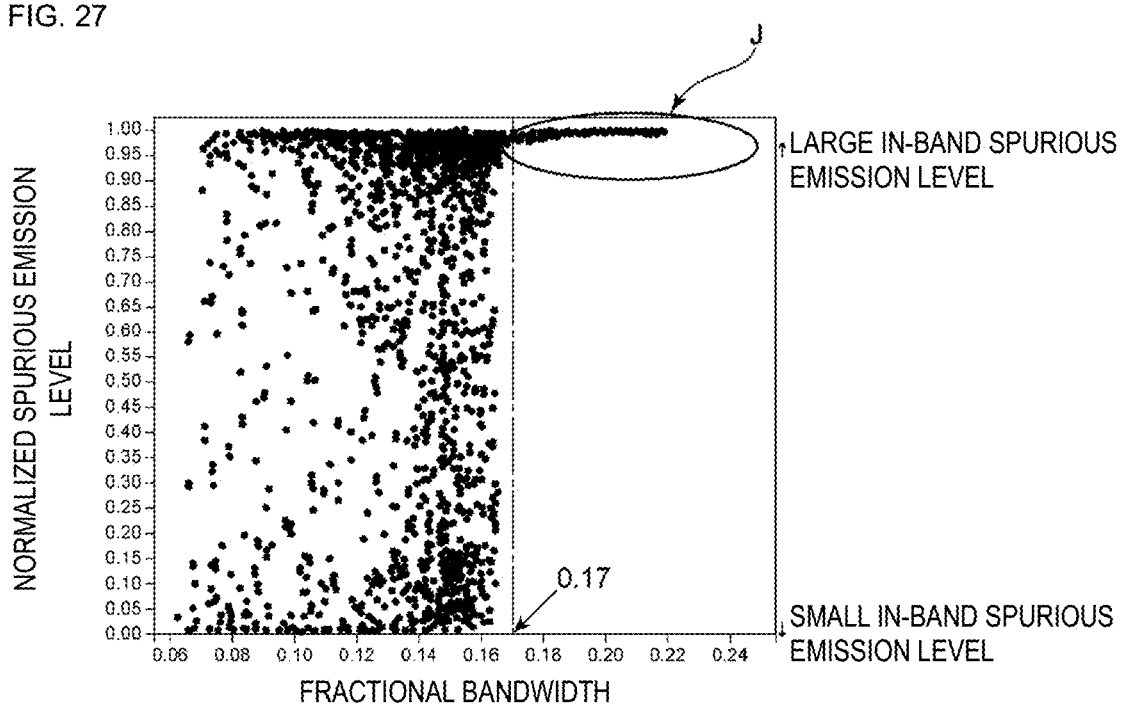
FIG. 27 is a graph illustrating a relationship between the fractional bandwidth and a phase rotation amount of spurious impedance normalized by 180 degrees as the magnitude of the spurious emission.

FIG. 27 is a graph illustrating a relationship between the fractional bandwidth and a phase rotation amount of spurious impedance normalized by about 180 degrees as the magnitude of the spurious emission when a large number of acoustic wave resonators are configured according to the present preferred embodiment. The fractional bandwidth was adjusted by variously changing the film thickness of the piezoelectric layer and the dimension of the electrodes. In addition, although FIG. 27 illustrates the results in the case of using the piezoelectric layer formed of the Z-cut $LiNbO_3$, the same tendency is obtained also in the case of using the piezoelectric layer having another cut angle.

In a region surrounded by an ellipse J in FIG. 27, a spurious emission level is as large as about 1.0. As is clear from FIG. 27, when the fractional bandwidth exceeds about 0.17, that is, when the fractional bandwidth exceeds about 17%, a large spurious emission having the spurious emission level of equal to or more than about 1 appears in the pass band even when the parameters defining the fractional bandwidth are changed. That is, as in the resonance characteristics illustrated in FIG. 26, the large spurious emission indicated by the arrow B appears in the band. Therefore, the fractional bandwidth is preferably equal to or less than about 17%. In this case, the spurious emission can be reduced by adjusting the film thickness of the piezoelectric layer 2, the dimension of the electrodes 3 and 4, and the like.

Figure 28:
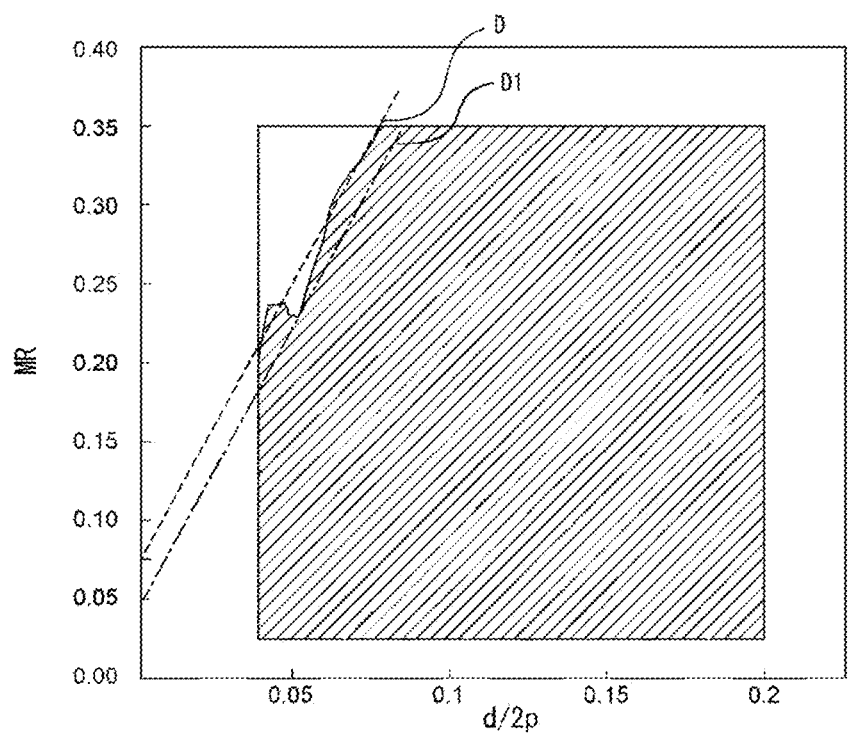
FIG. 28 is a graph illustrating a relationship between d/2p and a metallization ratio MR.

FIG. 28 illustrates a relationship between d/2p, the metallization ratio MR, and the fractional bandwidth. In the above acoustic wave device, various acoustic wave devices having different d/2p and different MRs were provided, and the fractional bandwidth was measured. A hatched portion on the right side of a broken line D in FIG. 28 is a region where the fractional bandwidth is equal to or less than about 17%. The boundary between the hatched region and the non-hatched region is represented by MR=3.5 (d/2p)+0.075. That is, MR=1.75 (d/p)+0.075 is satisfied. Therefore, preferably MR≤1.75 (d/p)+0.075 is satisfied. In this case, the fractional bandwidth is likely to be equal to or less than about 17%. More preferably, it is the region on the right side of MR=3.5 (d/2p)+0.05 indicated by an alternate long and short dash line D1 in FIG. 28. That is, when MR≤1.75 (d/p)+0.05 is satisfied, the fractional bandwidth can be reliably set to equal to or less than about 17%.

Figure 29:
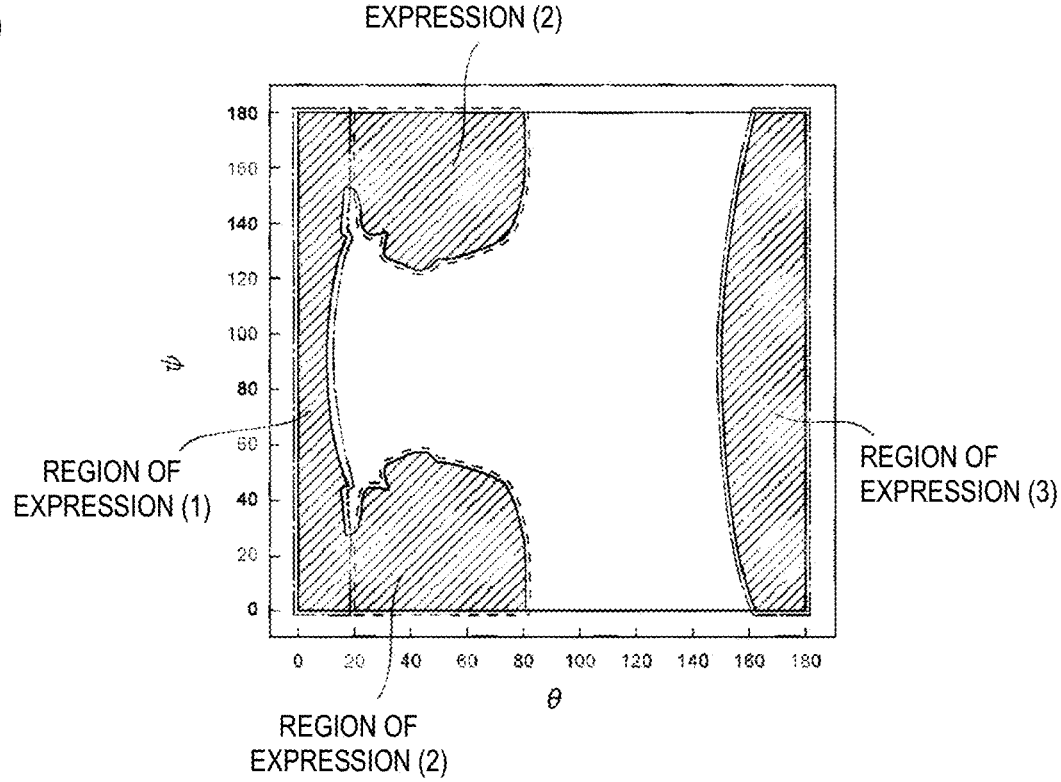
FIG. 29 is a diagram illustrating a map of the fractional bandwidth with respect to the Euler angles (0°, θ, ψ) of LiNbO$_3$ when d/p is made as close to 0 as possible.

FIG. 29 is a diagram illustrating a map of the fractional bandwidth with respect to the Euler angles (0°, θ, ψ) of $LiNbO_3$ when d/p is made as close to 0 as possible. A hatched portion in FIG. 29 is a region in which the fractional bandwidth of at least equal to or more than 5% is obtained, and when the range of the region is approximated, the range is represented by the following Expression (1), Expression (2), and Expression (3).

$$(0°\pm 10°, 0° \text{ to } 20°, \text{arbitrary } \psi) \quad \text{Expression (1)}$$

$$(0°\pm 10°, 20° \text{ to } 80°, 0° \text{ to } 60°(1-(\theta-50)^2/900)^{1/2}) \text{ or}$$
$$(0°\pm 10°, 20° \text{ to } 80°, [180°-60°(1-(\theta-50)^2/900)^{1/2}] \text{ to } 180°) \quad \text{Expression (2)}$$

$$(0°\pm 10°, [180°-30°(1-(\psi-90)^2/8100)^{1/2}] \text{ to } 180°, \text{arbitrary } \psi) \quad \text{Expression (3)}$$

Therefore, in the case of the Euler angle range of the above Expression (1), Expression (2) or Expression (3), the fractional bandwidth can be sufficiently widened, which is preferable. The same applies to the case where the piezoelectric layer 2 is a lithium tantalate layer.

Figure 30:
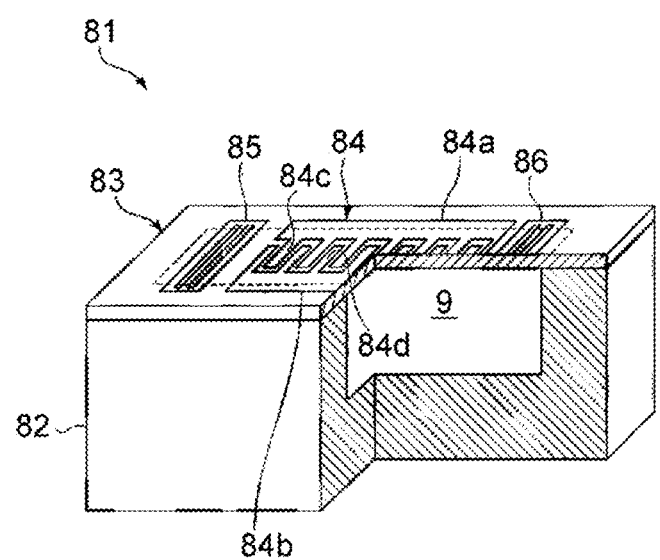
FIG. 30 is a partially cutaway perspective view for explaining an acoustic wave device using Lamb waves.

FIG. 30 is a partially cutaway perspective view for explaining an acoustic wave device using Lamb waves.

An acoustic wave device 81 includes a support substrate 82. The support substrate 82 is provided with a recess that is open to an upper surface. A piezoelectric layer 83 is stacked on the support substrate 82. Thus, the cavity portion 9 is provided. An IDT electrode 84 is provided on the piezoelectric layer 83 above the cavity portion 9. Reflectors

85 and 86 are provided on both sides of the IDT electrode 84 in an acoustic wave propagation direction. In FIG. 30, an outer peripheral edge of the cavity portion 9 is indicated by a broken line. Here, the IDT electrode 84 includes first and second busbars 84a and 84b, a plurality of first electrode fingers 84c, and a plurality of second electrode fingers 84d. The plurality of first electrode fingers 84c is connected to the first busbar 84a. The plurality of second electrode fingers 84d is connected to the second busbar 84b. The plurality of first electrode fingers 84c and the plurality of second electrode fingers 84d are interdigitated with each other.

In the acoustic wave device 81, Lamb waves as plate waves are excited by applying an AC electric field to the IDT electrode 84 on the above cavity portion 9. Since the reflectors 85 and 86 are provided on both sides, resonance characteristics due to the above Lamb waves can be obtained.

As described above, acoustic wave devices according to preferred embodiments of the present invention may use plate waves. In this case, the IDT electrode 84 and the reflector 85, and the reflector 86 illustrated in FIG. 30 may be provided on the piezoelectric layer 14 in each of the above first to third preferred embodiments and the modifications thereof.

In the first to fourth preferred embodiments, an example in which the support includes only the support substrate is illustrated. However, as in the example illustrated in FIG. 20, the support may include an insulating layer. In this case, the cavity portion of the support may be provided only in the insulating layer or only in the support substrate. Alternatively, the cavity portion may be provided in both of the insulating layer and the support substrate.

In the acoustic wave device using the bulk waves in the thickness-shear mode of each of the first to third preferred embodiments and the modifications, d/p is preferably equal to or less than about 0.5 and more preferably equal to or less than about 0.24 as described above. As a result, even better resonance characteristics can be obtained. Furthermore, in the acoustic wave device using the bulk waves in the thickness-shear mode of each of the first to third preferred embodiments and the modifications, MR≤1.75 (d/p)+0.075 is preferably satisfied as described above. In this case, the spurious emission can be more reliably suppressed.

It is preferable that the piezoelectric layer 14 in the acoustic wave device using the bulk waves in the thickness-shear mode of each of the first to third preferred embodiments and the modifications thereof is made of lithium niobate or lithium tantalate. Preferably, the Euler angles ($\varphi$, $\theta$, $\psi$) of lithium niobate or lithium tantalate forming the piezoelectric layer 14 are in the range of the above Expression (1), Expression (2), or Expression (3). In this case, the fractional bandwidth can be sufficiently widened.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a support including a support substrate;
a piezoelectric layer on the support; and
an excitation electrode on the piezoelectric layer; wherein
a cavity portion is provided in the support, at least a portion of the excitation electrode overlaps the cavity portion in a plan view;
a portion of the piezoelectric layer overlapping the cavity portion in a plan view is a membrane portion, the membrane portion extends in a first direction and a second direction orthogonal or substantially orthogonal to the first direction, and the membrane portion includes a central portion in a center in the first direction, a first portion and a second portion facing each other across the central portion in the first direction, and an outer peripheral edge;
at least a portion of the outer peripheral edge in each of the first portion and the second portion of the membrane portion is located in an outer side portion in the second direction relative to the outer peripheral edge in the central portion; and
a width of at least a portion of the central portion in the second direction is constant or substantially constant along the first direction.

2. The acoustic wave device according to claim 1, wherein
the outer peripheral edge of the membrane portion includes a first outer peripheral edge portion and a second outer peripheral edge portion facing each other in the second direction; and
in each of the first outer peripheral edge portion and the second outer peripheral edge portion, respective portions in the first portion and the second portion are located in the outer side portion in the second direction relative to the portion located in the central portion.

3. The acoustic wave device according to claim 1, wherein the membrane portions has a hammerhead shape in the first and second portions.

4. The acoustic wave device according to claim 1, wherein the first portion and the second portion are located at a pair of end portions of the membrane portion that face each other in the first direction.

5. The acoustic wave device according to claim 1, wherein the first portion and the second portion include a pair of end edge portions of the membrane portion that face each other in the first direction.

6. The acoustic wave device according to claim 1, wherein a pair of end edge portions of the membrane portion that face each other in the first direction has a curved shape in a plan view.

7. The acoustic wave device according to claim 1, wherein, in the membrane portion, a dimension along the first direction is larger than a dimension along the second direction.

8. The acoustic wave device according to claim 1, wherein the piezoelectric layer includes lithium tantalate or lithium niobate.

9. The acoustic wave device according to claim 1, wherein the excitation electrode is an interdigital transducer (IDT) electrode including a plurality of electrode fingers.

10. The acoustic wave device according to claim 9, wherein the acoustic wave device is structured to use plate waves.

11. The acoustic wave device according to claim 9, wherein the acoustic wave device is structured to use bulk waves in a thickness-shear mode.

12. The acoustic wave device according to claim 11, wherein
the piezoelectric layer includes lithium tantalate or lithium niobate; and
Euler angles ($\phi$, $\theta$, $\psi$) of the lithium tantalate or the lithium niobate forming the piezoelectric layer are in a range of the following Expression (1), Expression (2), or Expression (3):

$$(0°\pm10°, 0° \text{ to } 20°, \text{arbitrary } \psi) \quad \text{Expression (1);}$$

$$(0°\pm10°, 20° \text{ to } 80°, 0° \text{ to } 60°(1-(\theta-50)^2/900)^{1/2}) \text{ or}$$
$$(0°\pm10°, 20° \text{ to } 80°, [180°-60°(1-(\theta-50)^2/900)^{1/2}] \text{ to } 180°) \quad \text{Expression (2); or}$$

$$(0°\pm10°, [180°-30°(1-(\psi-90)^2/8100)^{1/2}] \text{ to } 180°, \text{arbitrary } \psi) \quad \text{Expression (3).}$$

13. The acoustic wave device according to claim 9, wherein, when a thickness of the piezoelectric layer is defined as d and a center-to-center distance between adjacent electrode fingers of the plurality of electrode fingers is defined as p, d/p is equal to or less than about 0.5.

14. The acoustic wave device according to claim 13, wherein d/p is equal to or less than about 0.24.

15. The acoustic wave device according to claim 1, wherein the first and second portions have an elliptical or substantially elliptical shape.

16. The acoustic wave device according to claim 1, wherein
  the piezoelectric layer includes a first main surface and a second main surface facing each other;
  the excitation electrode includes an upper electrode on the first main surface of the piezoelectric layer and a lower electrode on the second main surface;
  a region where the upper electrode and the lower electrode face each other across the piezoelectric layer is a facing region; and
  the membrane portion includes an excitation region in which an acoustic wave is excited by the upper electrode and the lower electrode, the excitation region being a portion located in the facing region of the membrane portion.

17. The acoustic wave device according to claim 1, wherein the cavity portion is defined by a recess in the support.

18. The acoustic wave device according to claim 1, wherein the cavity portion is defined by a through-hole in the support.

19. An acoustic wave device comprising:
  a support including a support substrate;
  a piezoelectric layer on the support; and
  an excitation electrode on the piezoelectric layer; wherein
  a cavity portion is provided in the support, at least a portion of the excitation electrode overlaps the cavity portion in a plan view;
  a portion of the piezoelectric layer overlapping the cavity portion in a plan view is a membrane portion, the membrane portion extends in a first direction and a second direction orthogonal or substantially orthogonal to the first direction, and the membrane portion includes a central portion in a center in the first direction, a first portion and a second portion facing each other across the central portion in the first direction, and an outer peripheral edge;
  at least a portion of the outer peripheral edge in each of the first portion and the second portion of the membrane portion is located in an outer side portion in the second direction relative to the outer peripheral edge in the central portion;
  the excitation electrode is an interdigital transducer (IDT) electrode including a plurality of electrode fingers;
  the plurality of electrode fingers are arranged in the first direction; and
  at least one of the plurality of electrode fingers is located in an outer side portion relative to the first portion in the first direction, and at least one of the plurality of electrode fingers is located in an outer side portion relative to the second portion in the first direction.

20. An acoustic wave device comprising:
  a support including a support substrate;
  a piezoelectric layer on the support; and
  an excitation electrode on the piezoelectric layer; wherein
  the acoustic wave device is structured to use bulk waves in a thickness-shear mode;
  a cavity portion is provided in the support, at least a portion of the excitation electrode overlaps the cavity portion in a plan view;
  a portion of the piezoelectric layer overlapping the cavity portion in a plan view is a membrane portion, the membrane portion extends in a first direction and a second direction orthogonal or substantially orthogonal to the first direction, and the membrane portion includes a central portion in a center in the first direction, a first portion and a second portion facing each other across the central portion in the first direction, and an outer peripheral edge;
  at least a portion of the outer peripheral edge in each of the first portion and the second portion of the membrane portion is located in an outer side portion in the second direction relative to the outer peripheral edge in the central portion;
  the excitation electrode is an interdigital transducer (IDT) electrode including a plurality of electrode fingers;
  a region at which adjacent electrode fingers of the plurality of electrode fingers overlap each other when the IDT electrode is viewed in a direction in which the adjacent electrode fingers face each other is an excitation region; and
  when a metallization ratio of the plurality of electrode fingers with respect to the excitation region is defined as MR, a thickness of the piezoelectric layer is defined as d, and a center-to-center distance between adjacent electrode fingers of the plurality of electrode fingers is defined as p, MR≤1.75 (d/p)+0.075 is satisfied.

\* \* \* \* \*